United States Patent
Nakagawa

(10) Patent No.: US 7,560,329 B2
(45) Date of Patent: Jul. 14, 2009

(54) SEMICONDUCTOR DEVICE AND METHOD FOR FABRICATING THE SAME

(75) Inventor: Shinichi Nakagawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/826,251

(22) Filed: Jul. 13, 2007

(65) Prior Publication Data
US 2007/0259491 A1    Nov. 8, 2007

Related U.S. Application Data

(62) Division of application No. 10/872,554, filed on Jun. 22, 2004, now Pat. No. 7,307,332.

(30) Foreign Application Priority Data

Feb. 27, 2004    (JP) .............................. 2004-54618

(51) Int. Cl.
 *H01L 21/4763* (2006.01)
(52) U.S. Cl. .................... 438/199; 438/257; 438/265; 438/595; 438/763; 257/E21.244; 257/E21.422; 257/E21.636; 257/E21.637; 257/E21.689; 257/E23.114; 257/E27.081; 257/E27.103; 257/E29.129
(58) Field of Classification Search ......... 438/258–268, 438/199, 257, 595, 763; 257/E21.244, 422, 257/625, 636, 637, 642, 689, E23.114, E27.081, 257/103, E29.129
See application file for complete search history.

(56) References Cited

U.S. PATENT DOCUMENTS

| | | | | |
|---|---|---|---|---|
| 5,707,898 A | * | 1/1998 | Keller et al. | 438/265 |
| 6,355,524 B1 | * | 3/2002 | Tuan et al. | 438/257 |
| 6,376,879 B2 | | 4/2002 | Mori et al. | |
| 6,953,967 B2 | | 10/2005 | Kasuya | |
| 7,109,079 B2 | * | 9/2006 | Schaeffer et al. | 438/199 |
| 2004/0046212 A1 | | 3/2004 | Takahashi | |

FOREIGN PATENT DOCUMENTS

| | | |
|---|---|---|
| EP | 2001007227 | 1/2001 |
| JP | 2001-15753 A | 1/2001 |
| JP | 2003/17596 | 1/2003 |
| JP | 2002-315760 * | 4/2003 |
| JP | 2003-243620 A | 8/2003 |
| JP | 2004-152954 | 5/2004 |
| KR | 1001-70515 B1 | 10/1998 |

* cited by examiner

*Primary Examiner*—Michael S Lebentritt
(74) *Attorney, Agent, or Firm*—Westerman, Hattori, Daniels & Adrian, LLP.

(57) ABSTRACT

The semiconductor device comprises a gate electrode 112 formed over a semiconductor substrate 10, a sidewall spacer 116 formed on the side wall of the gate electrode 112, a sidewall spacer 144 formed on the side wall of the gate electrode 112 with the sidewall spacer 116 formed on, and an oxide film 115 formed between the sidewall spacer 116 and the sidewall spacer 144, and the semiconductor substrate 10. The film thickness of the oxide film 115 between the sidewall spacer 144 and the semiconductor substrate 10 is thinner than the film thickness of the oxide film 115 between the sidewall spacer 116 and the semiconductor substrate 10.

9 Claims, 29 Drawing Sheets

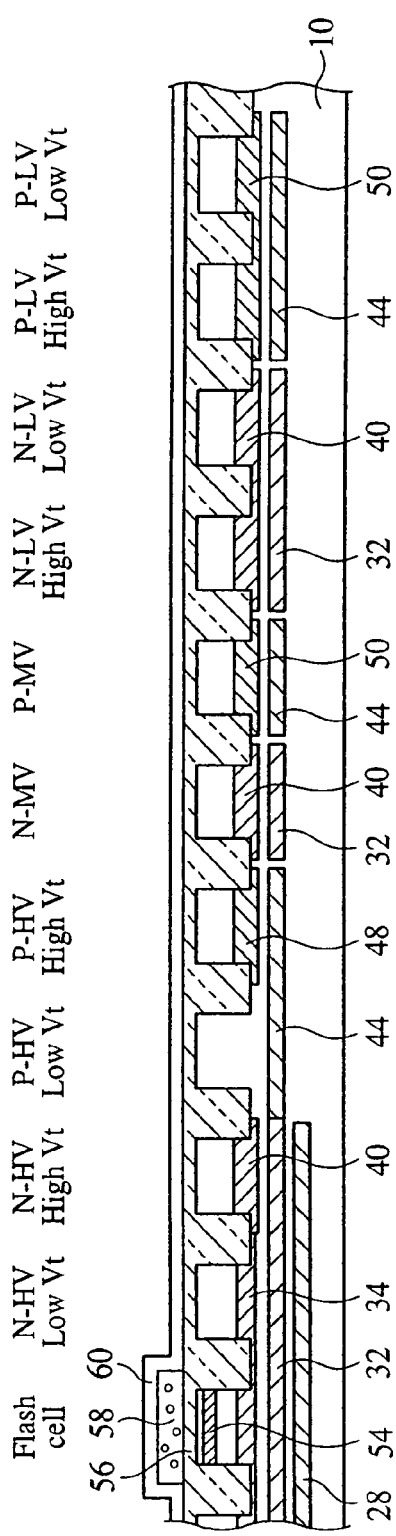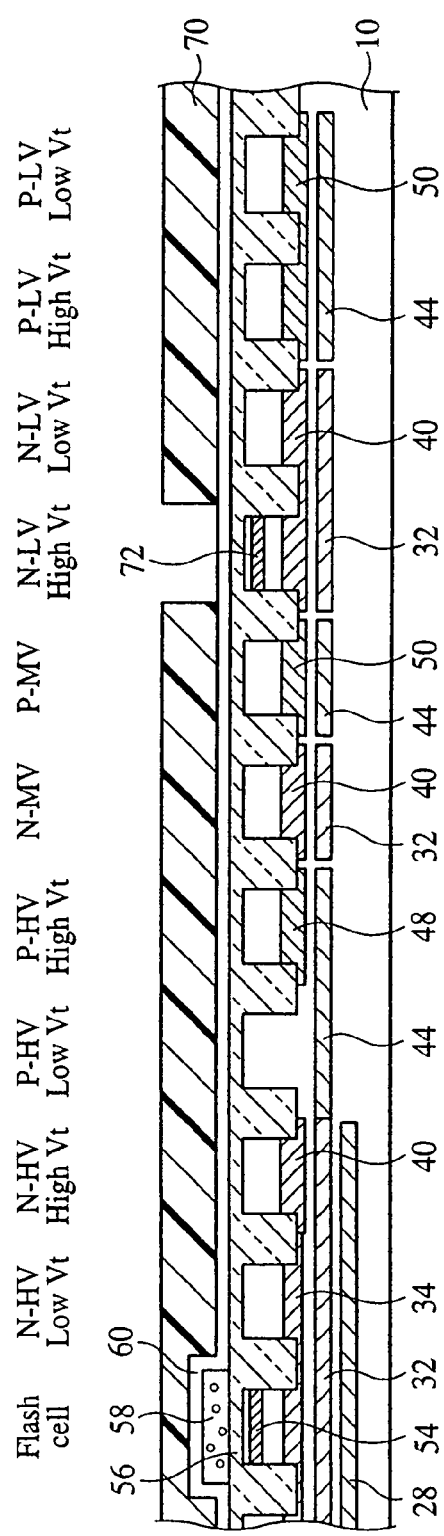
FIG. 8A
FIG. 8B

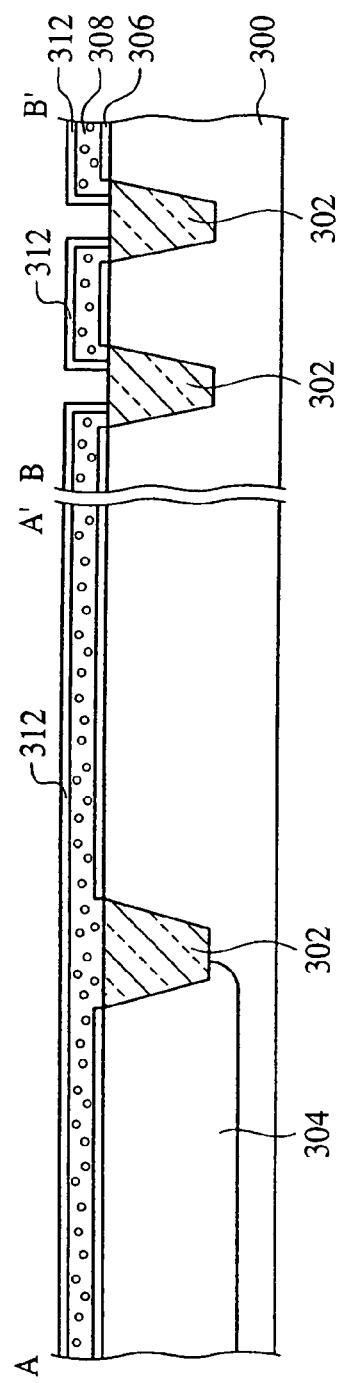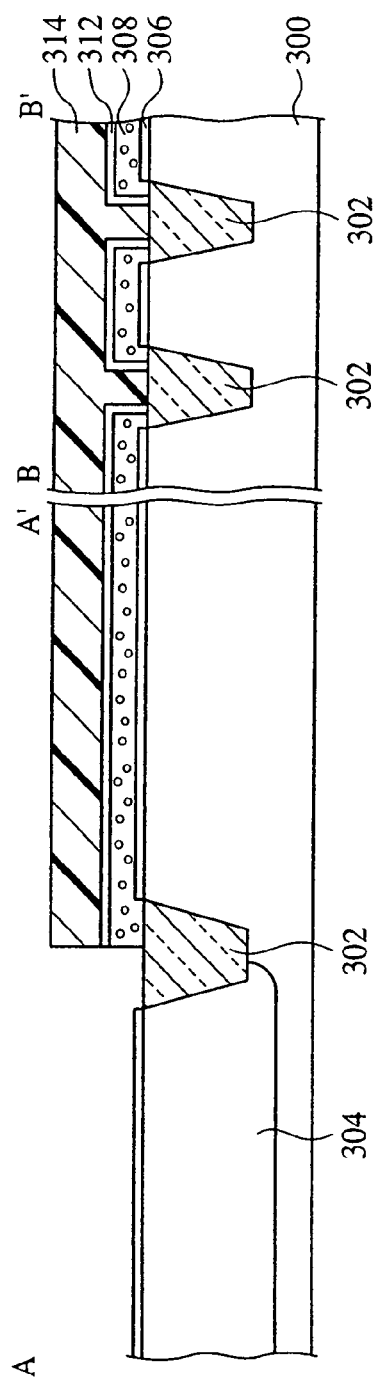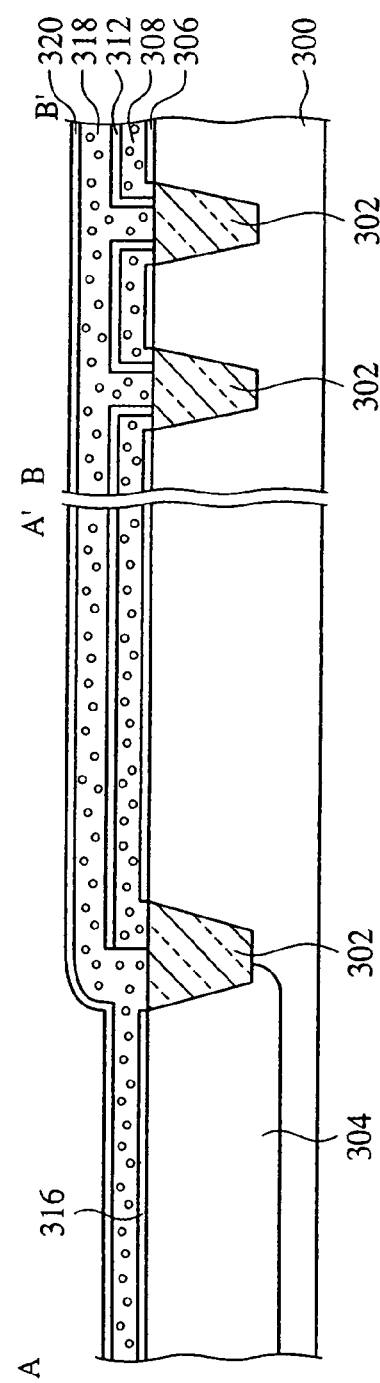

SEMICONDUCTOR DEVICE AND METHOD FOR FABRICATING THE SAME

CROSS-REFERENCE TO RELATED APPLICATIONS

This application is a divisional of Ser. No. 10/872,554, filed Jun. 22, 2004, which is based upon and claims the benefit of priority from the prior Japanese Patent Application No. 2004-54618, filed on Feb. 27, 2004, the entire contents of which are incorporated herein by reference.

BACKGROUND OF THE INVENTION

The present invention relates to a semiconductor device and a method for fabricating the semiconductor device, more specifically, a logic semiconductor device combined with a non-volatile memory and a method for fabricating the same.

Logic semiconductor devices combined with non-volatile memory devices form product fields, as of CPLD (Complex Programmable Logic Device) and FPGA (Field Programmable Gate Array), and because of their characteristic of programmability, so far have formed large markets because of their characteristic, programmability.

The logic semiconductor device combined with a non-volatile memory has, in addition to flash memory cells, high-voltage transistors for controlling the flash memory and low-voltage transistors for the high-performance logic circuit integrated on the same semiconductor chip. The flash memory cell has a stack gate electrode structure including a floating gate and a control gate, which is different from the single gate electrode structure of the high-voltage transistor and the lower-voltage transistor. Accordingly, the logic semiconductor device combined with a non-volatile memory has the characteristic fabrication processing of forming the single gate structure and the stack gate structure in the same process.

The related arts are described in e.g., Reference 1 (Japanese published unexamined patent application No. 2001-015753) and Reference 2 (Japanese published unexamined patent application No. 2003-243620).

SUMMARY OF THE INVENTION

In the logic semiconductor devices and the logic semiconductor devices combined with the conventional non-volatile semiconductor memories, silicon oxide film has been widely used as the sidewall spacers of both the peripheral transistors and the memory cell transistors. On the other hand, in the semiconductor memory devices as the discrete flash memories, silicon nitride film is often used from a view point that the silicon nitride film can improve the hot carrier immunity of the peripheral transistors can be improved.

Thus, in the logic semiconductor devices combined with the non-volatile semiconductor memories, the use of the sidewall spacer of the single layer structure of the silicon oxide film (single sidewall spacer structure) in the logic semiconductor devices and the sidewall spacer of the double layer structure including the sidewall spacer of the silicon nitride film and the sidewall spacer of the silicon oxide film (double sidewall spacer structure) in the non-volatile semiconductor memory devices is being studied so that the accumulated technical knowledge of the non-volatile semiconductor memory devices are utilized while the requirements of the logic semiconductor devices are satisfied.

However, the inventors of the present application have made earnest studies of such double sidewall spacer structure and found that defective contacts to the source/drain regions of the memory cell transistors take place.

An object of the present invention is to provide the logic semiconductor device combined with the non-volatile semiconductor memories, which has a structure which can suppress the defective contact to the source/drain regions of the memory cell transistors without causing characteristic changes, etc. of the peripheral devices, and a method for fabricating the same.

According to one aspect of the present invention, there is provided a semiconductor device comprising: a first transistor formed in a first region of a semiconductor substrate and including a first gate electrode; a first sidewall spacer formed on a side wall of the first gate electrode and formed of a first insulating film; a second sidewall spacer formed on the side wall of the first gate electrode with the first sidewall spacer formed on and formed of a second insulating film; and an oxide film formed between the semiconductor substrate, and the first sidewall spacer and the second sidewall spacer, a film thickness of the oxide film between the semiconductor substrate and the second sidewall spacer being thinner than a film thickness thereof between the semiconductor substrate and the first sidewall spacer.

According to another aspect of the present invention, there is provided a method for fabricating a semiconductor device comprising the steps of: forming a first conducting film over a semiconductor substrate having a first region and a second region; patterning the first conducting film in the first region to form a first gate electrode in the first region; forming by thermal oxidation an oxide film on the surface of the semiconductor substrate and a side wall of the first gate electrode; forming a first sidewall spacer of a first insulating film on the side wall of the first gate electrode with the oxide film formed on; removing the oxide film formed on the surface of the semiconductor substrate with the first sidewall spacer as a mask; and forming a second sidewall spacer of a second insulating film on the side wall of the first gate electrode with the oxide film and the first sidewall spacer formed on.

According to the present invention, in a non-volatile semiconductor memory having the double sidewall spacer structure including the first sidewall spacer and the second sidewall spacer sequentially laid the latter on the former, the film thickness of the silicon oxide film between the second sidewall spacer and the semiconductor substrate is smaller than the film thickness of the silicon oxide film between the first sidewall spacer and the semiconductor substrate, whereby the silicon oxide film on the source/drain regions of the non-volatile semiconductor memory can be completely removed by the usual step of fabricating a peripheral transistor and the pre-treatment of the salicide steps. Accordingly, the failure to form the silicide film on the source/drain regions of the non-volatile semiconductor memory can be prevented, and the defective contact can be suppressed.

BRIEF DESCRIPTION OF THE DRAWINGS

FIGS. 4A-4B, 5A-5B, 6A-6B, 7A-7B, 8A-8B, 9A-9B, 10A-10B, 11A-11B, 12A-12B, 13A-13B, 14A-14B, 15A-15B, 16A-16B, 17A-17B, 18, 19, 20A-20D, 21A-21C, and 22A-22C are sectional views of the semiconductor device according to the embodiment of the present invention in the steps of the method for fabricating the same, which show the method.

FIGS. 24A-24C, 25A-25C, 26A-26B, 27A-27C, 28A-28C, and 29A-29B are sectional views of the conventional semiconductor device in the steps of the method for fabricating the same, which show the method.

DETAILED DESCRIPTION OF THE INVENTION

Figure 23:
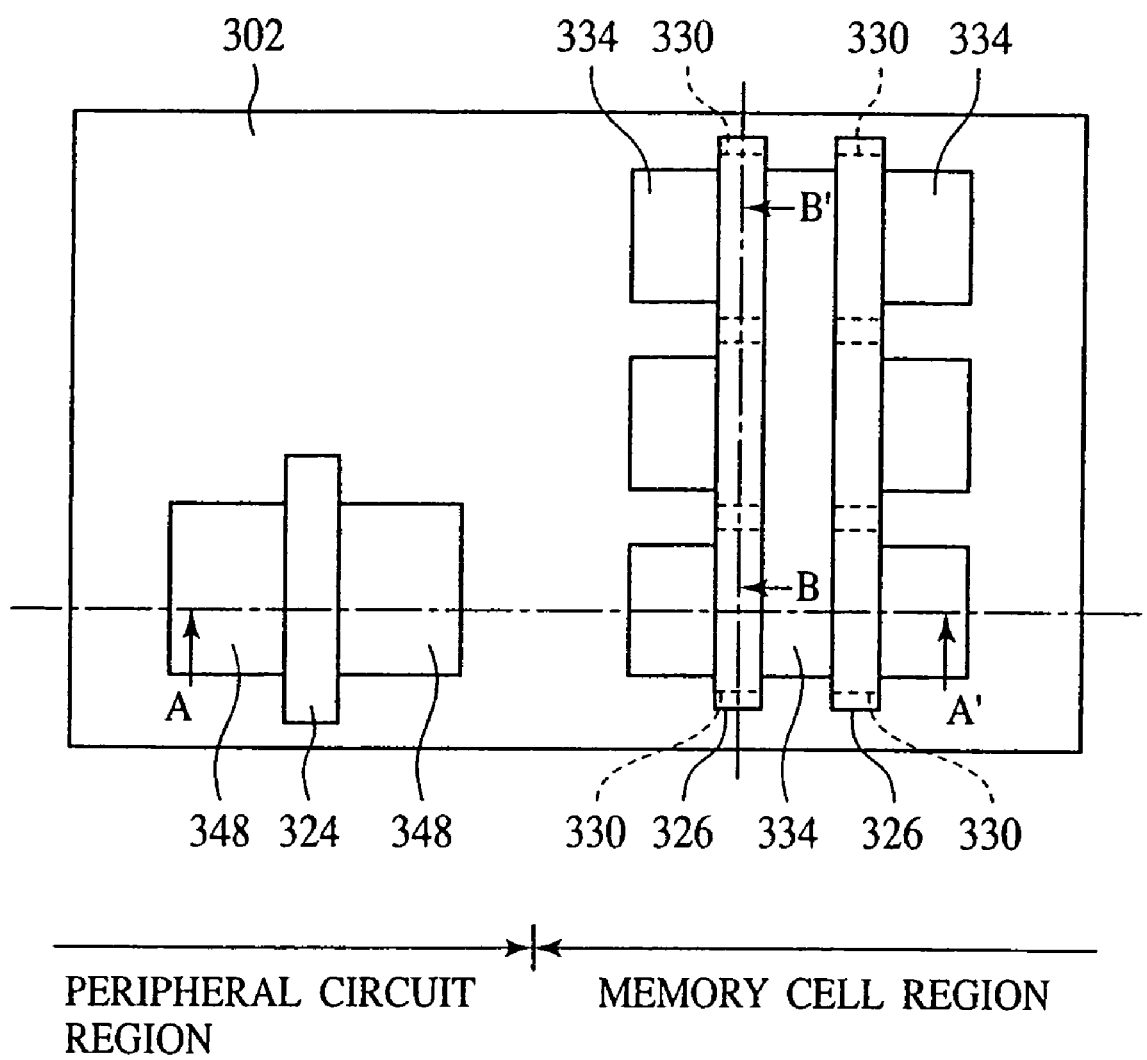
FIG. 23 is a plan view of the conventional semiconductor device, which shows the structure thereof.

The common method for fabricating the logic semiconductor device combined with the non-volatile semiconductor memory will be explained with reference to FIGS. 23 to 29B. FIG. 23 is a plan view of the conventional semiconductor device, which shows the structure thereof. FIGS. 24A to 29B are sectional views of the semiconductor device in the steps of the method for fabricating the same, which show the method. In FIG. 23, the left side of the drawing shows the peripheral circuit region, and the right side of the drawing shows the memory cell region. In FIGS. 24A to 29B, the left sides of the respective drawings show the sectional views along the line A-A' in FIG. 23, and the left sides of the respective drawings show the sectional views along the line B-B' in FIG. 23.

Figure 24A:
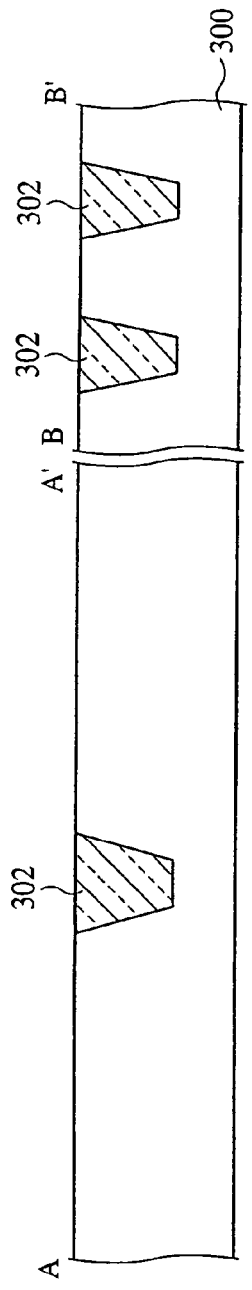

First, a device isolation film 302 is formed in a surface of a silicon substrate 300 by, e.g., LOCOS method or STI method (FIG. 24A). In the drawing, the device isolation film 302 is formed by STI method.

Next, dopant ions are implanted selectively into the peripheral circuit region of the silicon substrate 300 to form a well 304.

Figure 24B:
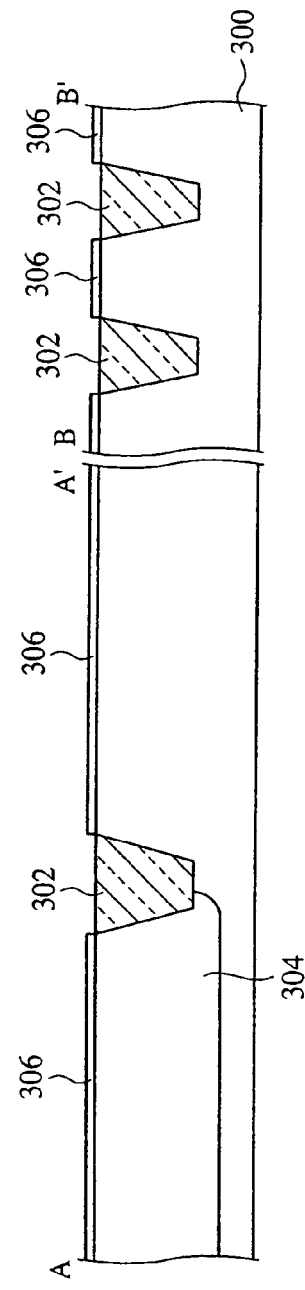

Then, the silicon substrate 300 is thermal oxidized to from a silicon oxide film 306 in the active regions defined by the device isolation film 302 (FIG. 24B). The silicon oxide film 306 is to be a tunnel oxide film in the memory cell region.

Then, a polycrystalline silicon film 308 is deposited on the silicon oxide film 306 by, e.g., CVD method. The polycrystalline silicon film 308 is to form a floating gate.

Figure 24C:
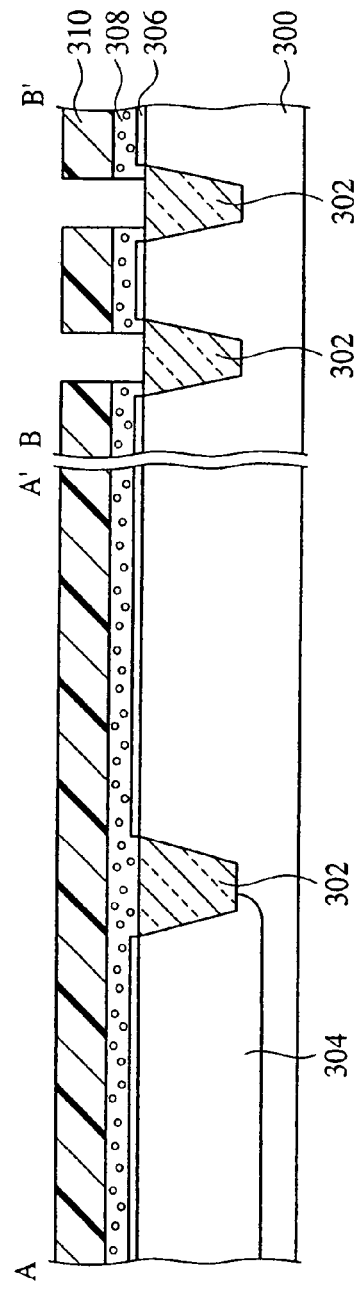

Then, a photoresist film 310 is formed by photolithography, and then with the photoresist film 310 as the mask, the polycrystalline silicon film 308 is dry etched to pattern the polycrystalline silicon film 308 (FIG. 24C). This patterning is for isolating the floating gate from the floating gate adjacent thereto in the direction of extension of the word line.

Then, the photoresist film 310 is removed, and then an insulating film 312 is formed on the patterned polycrystalline silicon film 308 (FIG. 25A). The insulating film 312 is to be the inter-layer insulating film between the floating gate and the control gate.

Next, a photoresist film covering the memory cell region and exposing the peripheral circuit region is formed by photolithography, and with the photoresist film 314 as the mask, the insulating film 312, the polycrystalline silicon film 308 and the silicon oxide film 306 are etched to expose the silicon substrate 300 in the peripheral circuit region (FIG. 25B).

Then, the photoresist film 314 is removed, and then the silicon substrate 300 is thermally oxidized to form the gate insulating film 316 for a peripheral transistor on the silicon substrate 300 in the peripheral circuit region.

Next, a polycrystalline silicon film 318 and a silicon nitride film 320 are formed on the entire surface by, e.g., CVD method (FIG. 25C). The polycrystalline silicon film 318 is to form the gate electrode of the peripheral transistor and the control gate of the memory cell transistor, and the silicon nitride film 320 is to be used as the anti-reflection film for lithography, the etching mask and the oxidation mask.

Then, a photoresist film 322 having the patterns of the gate electrode of the peripheral transistor and the control gate of the memory cell transistor are formed by photolithography.

Figure 26A:
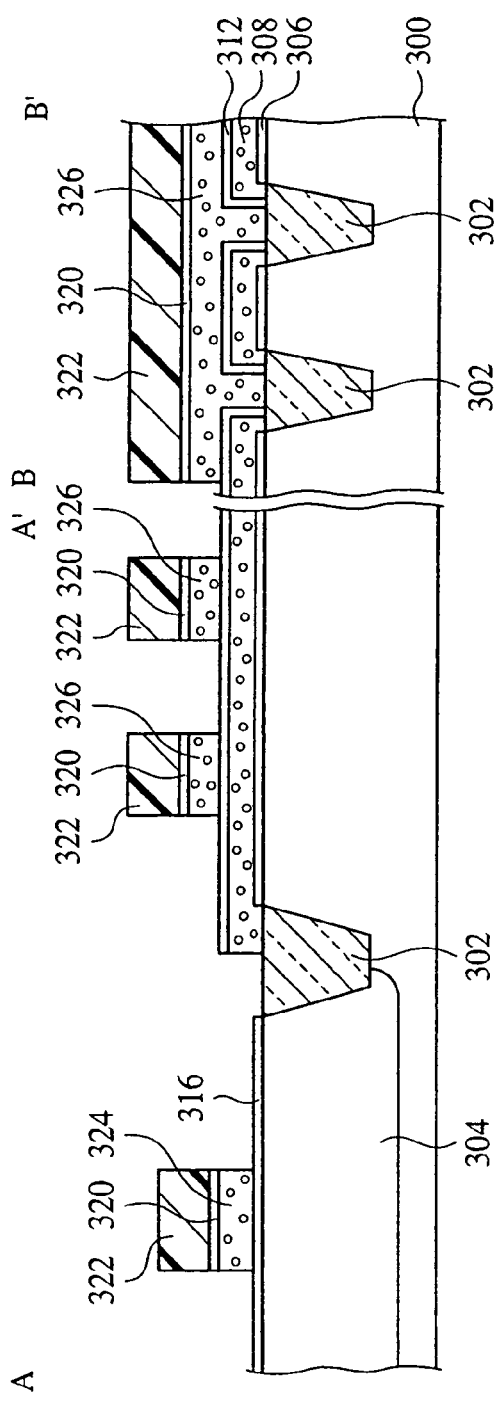

Next, with the photoresist film 322 as the mask, the silicon nitride film 320 and the polycrystalline silicon film 318 are patterned to form respectively the gate electrode 324 of the peripheral transistor of the polycrystalline silicon film 318 and the control gate 326 of the memory cell transistor of the polycrystalline silicon film 318 in the memory cell region (FIG. 26A).

Figure 26B:
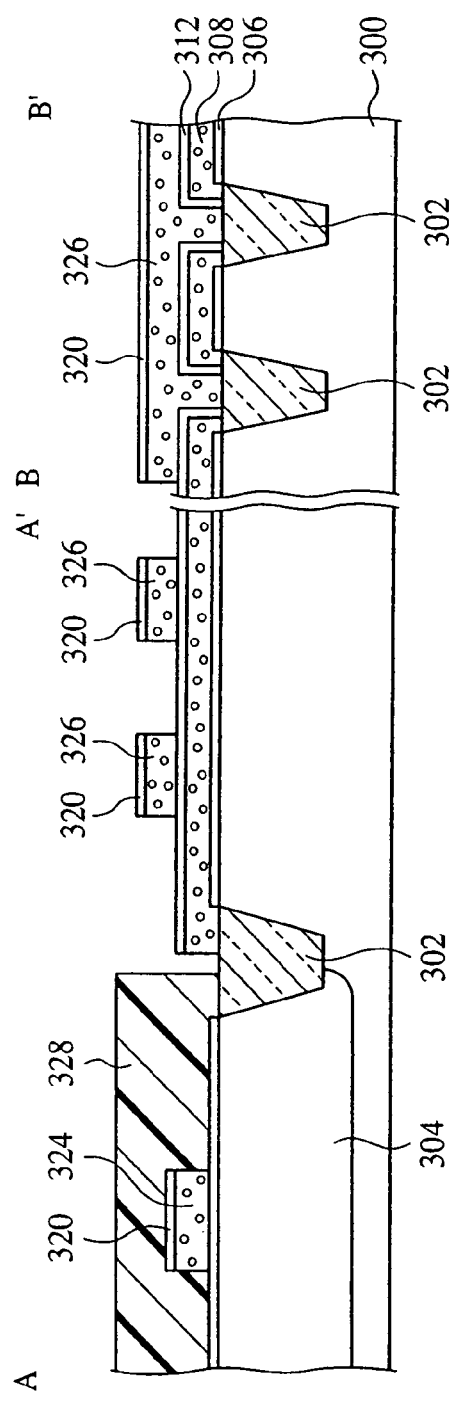

Next, the photoresist film 322 is removed, and then a photoresist film 328 covering the peripheral circuit region and exposing the memory cell region is formed (FIG. 26B).

Figure 27A:
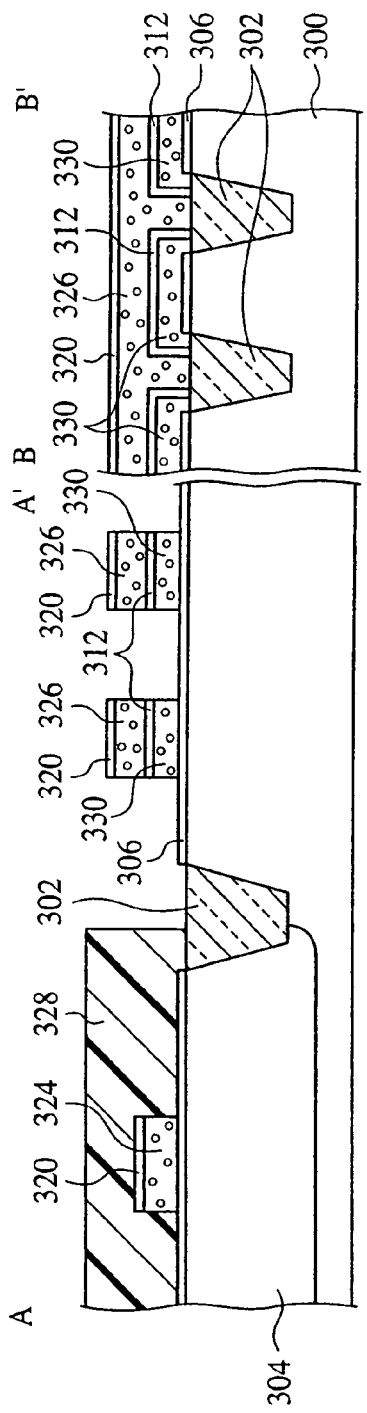

Then, with the photoresist film 328 and the silicon nitride film 320 as the mask, the insulating film 312 and the polycrystalline silicon film 308 are patterned to form the floating gate 330 of the polycrystalline silicon film 308 (FIG. 27A).

Next, thermal oxidation is performed with the silicon nitride film 320 as the oxidation mask to form a silicon oxide film 332 on the side surfaces of the gate electrode 324, the control gate 326 and the floating gate 330.

Figure 27B:
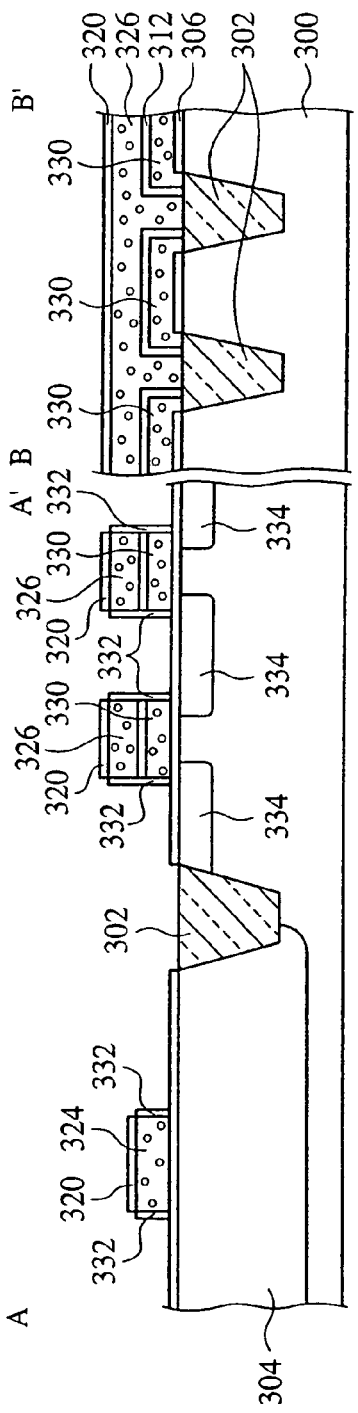

Then, with the control gate 326, etc. as the mask, ions are implanted selectively into the memory cell region to form source/drain regions in the semiconductor substrate 300 on both sides of the control gate 326 (FIG. 27B).

Figure 27C:
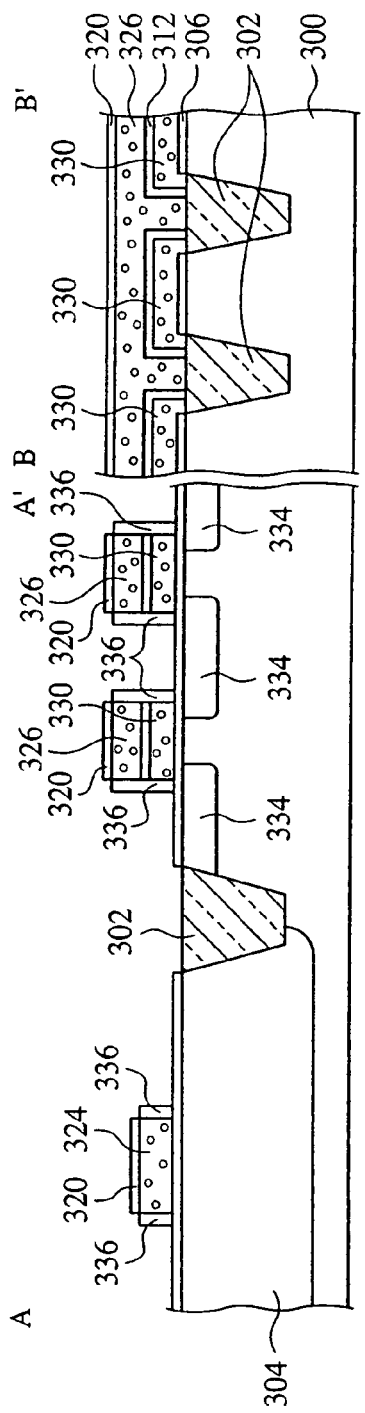

Next, with the silicon nitride film 320 as the oxidation mask, thermal oxidation is again performed to form a silicon oxide film 336 on the side surfaces of the gate electrode 324, the control gate 326 and the floating gate 330 (FIG. 27C).

Figure 28A:
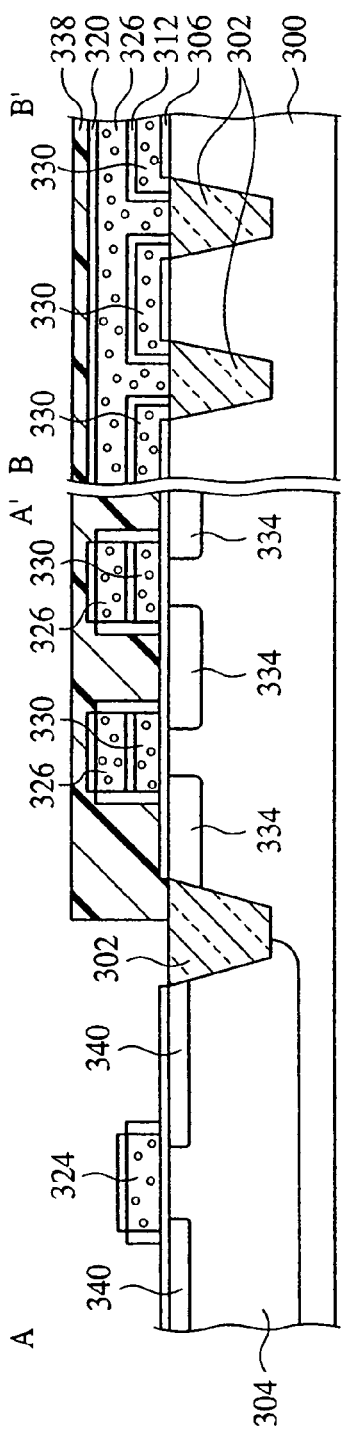

Next, a photoresist film 338 covering the memory cell region and exposing the peripheral circuit region is formed, and then, with the photoresist film 338, the gate electrode 324, etc. as the mask, dopant ions are implanted selectively in the peripheral circuit region to form LDD regions 340 of the peripheral transistor in the semiconductor substrate 300 on both sides of the gate electrode 324 (FIG. 28A).

Figure 28B:
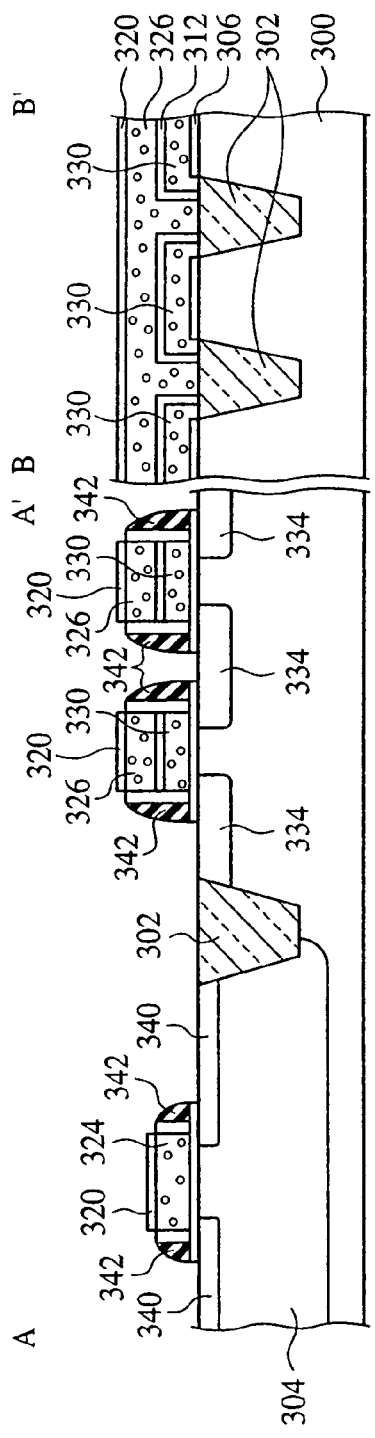
Figure 28C:
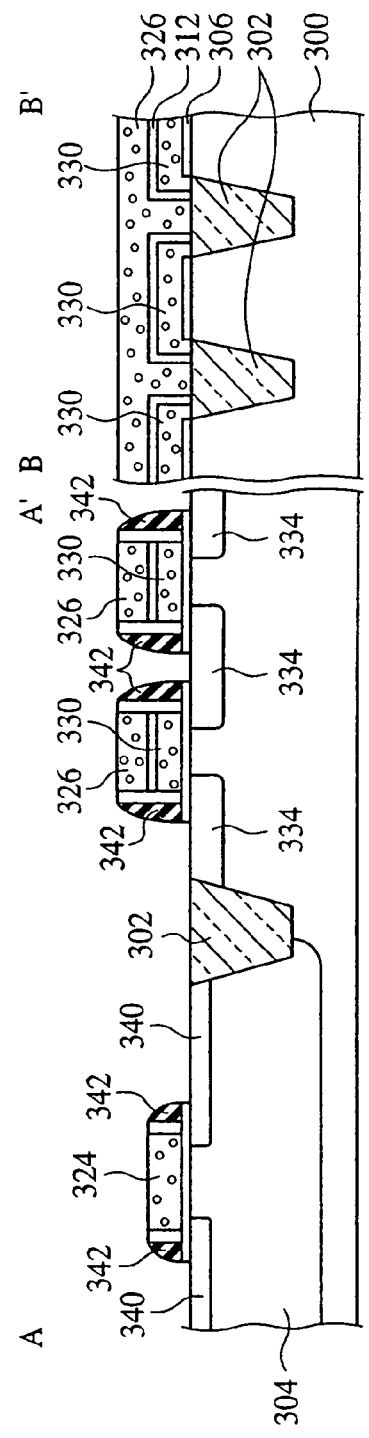

Next, a silicon oxide film is deposited by, e.g., CVD method and then anisotropically etched to form sidewall spacers 342 of the silicon oxide film on the side walls of the gate electrode 324 and the silicon nitride film 320 of the peripheral transistor and the side walls of the floating gate 330, the insulating film 312 and the control gate 326 and the silicon nitride film 320 of the memory cell transistor (FIG. 28B).

Then, the silicon nitride film 320 on the gate electrode 324 and the control gate 326 is removed by, e.g., wet etching.

Figure 29A:
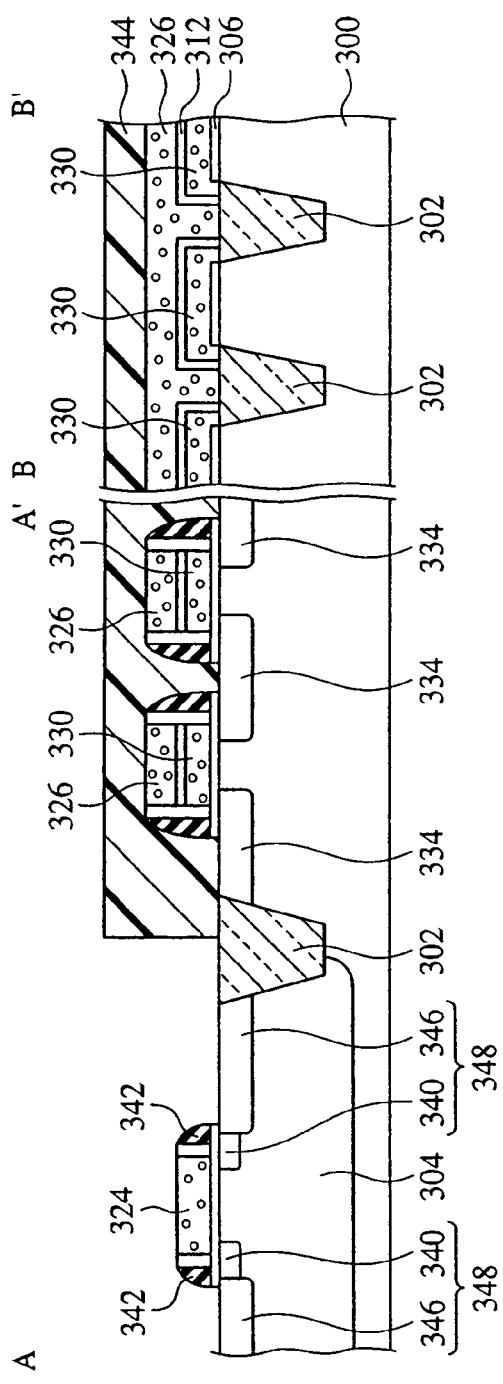

Next, a photoresist film 344 covering the memory cell region and exposing the peripheral circuit region is formed, and then with the gate electrode 324, the sidewall spacer 342, etc. as the mask, dopant ions are implanted selectively into the peripheral circuit region to form heavily doped regions 346. Thus, source/drain regions of the LDD structure including the LDD regions 340 and the heavily doped regions 346 are formed (FIG. 29A). In FIG. 23, the source/drain regions 334 between the control gates 326 is the source diffused layer (the common source line), and the source/drain regions 334 adjacent to each other with the control gate 326 therebetween are the drain diffused layer.

Figure 29B:
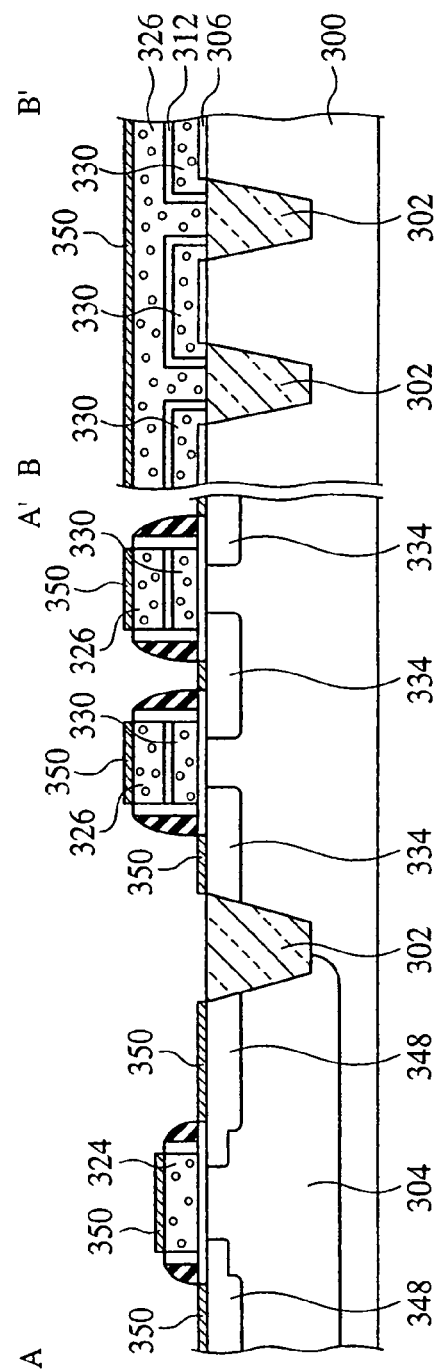

Then, the photoresist film 344 is removed, and then a silicide film 350 is formed by the usual salicide processing on the gate electrode 324, the control gate 326, the source/drain regions 348 and the source/drain regions 334 (FIG. 29B).

Then, the usual multi-level interconnection processing follows, and the logic semiconductor device combined with the non-volatile semiconductor memories is completed.

Embodiment

The semiconductor device and the method for fabricating the same according to one embodiment of the present invention will be explained with reference to FIGS. 1 to 22C.

Figure 1:
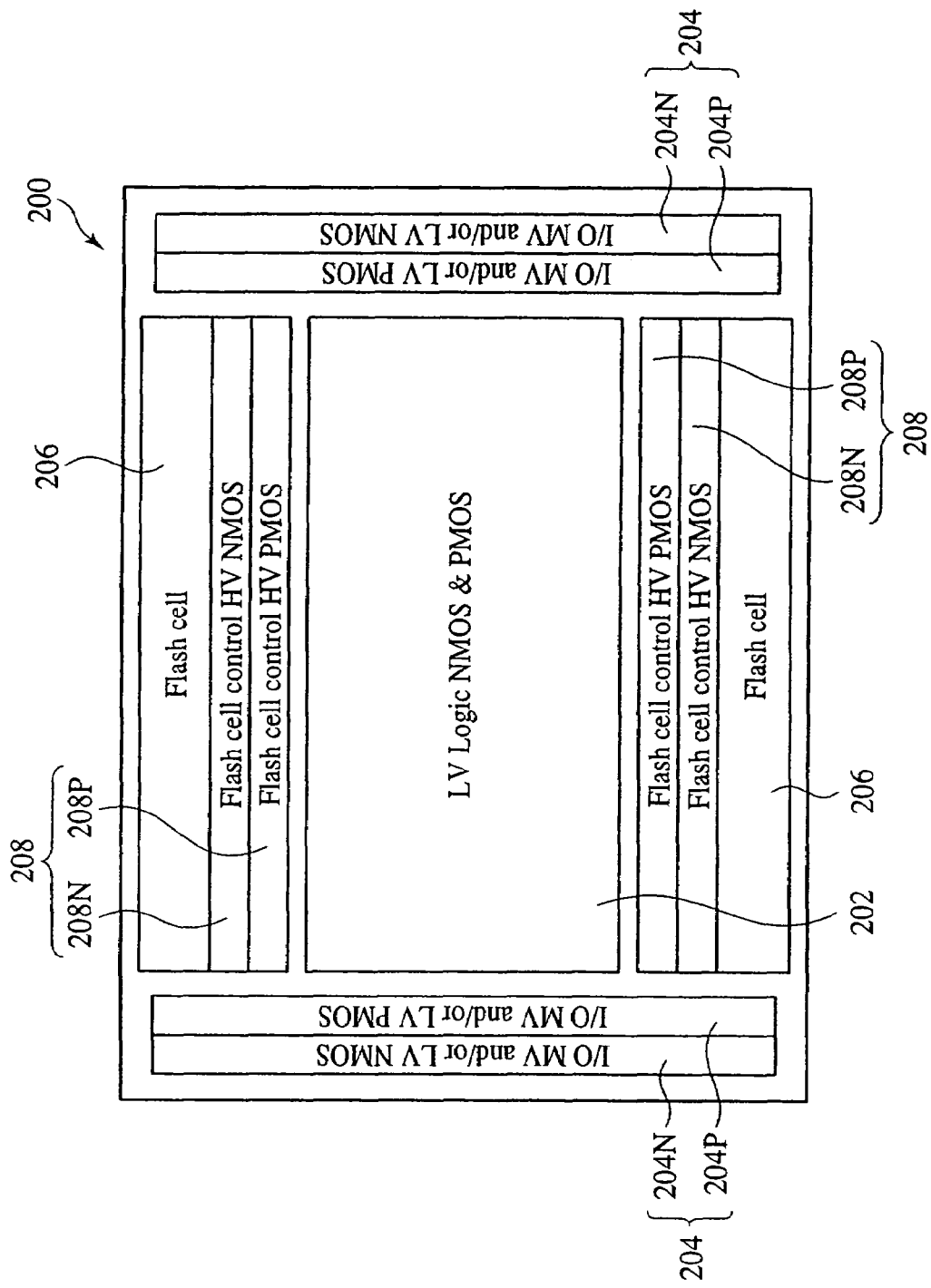
FIG. 1 is a plan view of the semiconductor device according to one embodiment of the present invention, which shows the structure thereof.
Figure 2:
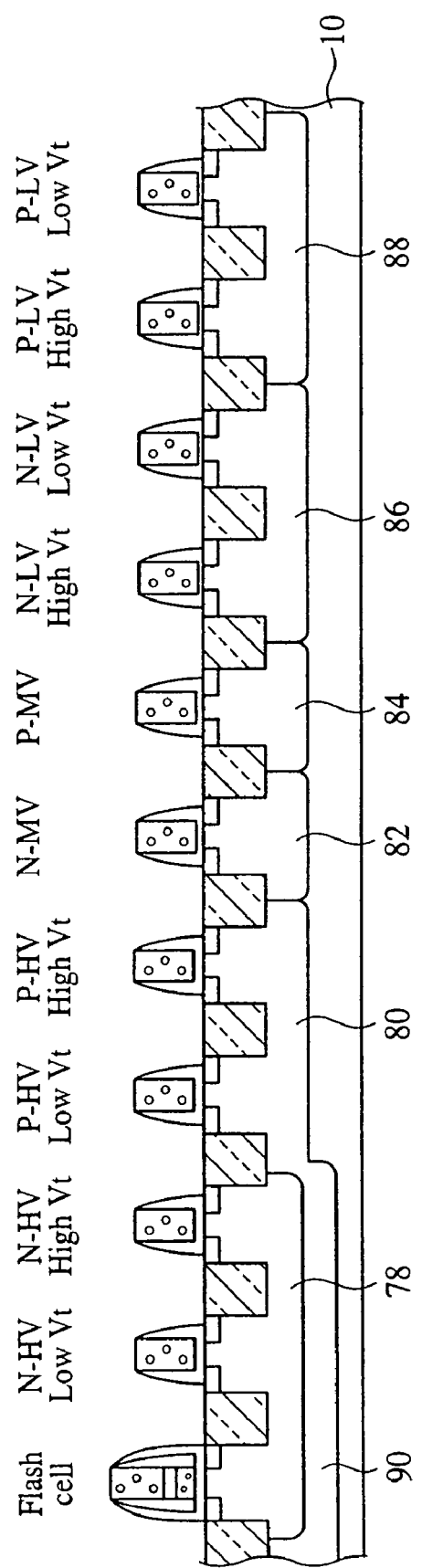
FIGS. 2 and 3 are diagrammatic sectional views of the semiconductor device according to the embodiment of the present invention, which show the structure thereof.
Figure 3:
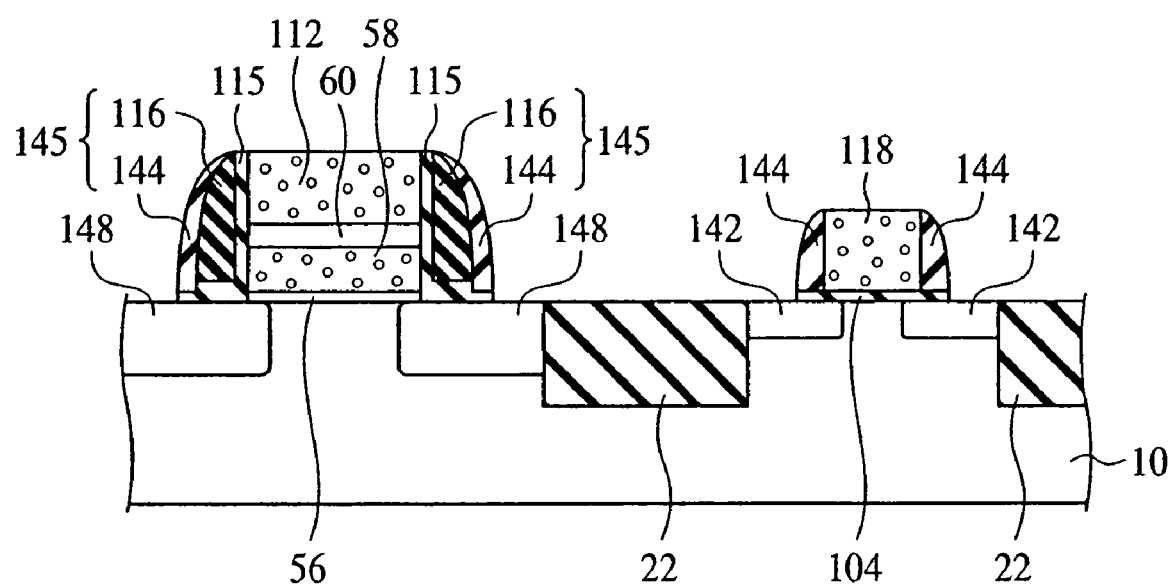

FIG. 1 is a chip conceptual view of the semiconductor device according to the present embodiment, which shows the structure thereof. FIG. 2 is a conceptual sectional view of 11 kinds of transistors used in the semiconductor device according to the present embodiment. FIG. 3 is a diagrammatic sectional view of the semiconductor device according to the present embodiment, which shows the structure thereof. FIGS. 4A to 22C are sectional views of the semiconductor device according to the present embodiment in the steps of the method for fabricating the semiconductor device, which show the method.

As shown in FIG. 1, the semiconductor device according to the present embodiment is a logic semiconductor device combined with a flash memory and comprises a main logic circuit unit 202, an input/output circuit unit 204, a flash memory cell unit 206, and a flash memory cell control circuit unit 208. The input/output circuit unit 204 includes a PMOS unit 204P and an NPOS unit 204N, and the flash memory cell control circuit unit 208 includes a PMOS unit 208P and an NMOS unit 208N.

As shown in FIG. 2, the semiconductor device according to the present embodiment comprises a flash memory cell (Flash cell), an n-channel high-voltage/low-threshold voltage transistor (N-HV Low Vt) and an n-channel high-voltage/low threshold voltage transistor (N-HV High Vt) formed in a p-well 78 in an n-well 90; a p-channel high-voltage/low-threshold voltage transistor (P-HV Low Vt) and a p-channel high-voltage/high-threshold voltage transistor (P-HV High Vt) formed in a n-well 80; an n-channel middle-voltage transistor (N-MV) formed in a p-well 82; a p-channel middle-voltage transistor (P-MV) formed in an n-well 84; an n-channel low-voltage/high threshold voltage transistor (N-LV High Vt) and an n-channel low-voltage low-threshold voltage transistor (N-LV Low Vt) formed in a p-well 86; and a p-channel low-voltage/high-threshold voltage transistor (P-LV High Vt) and a p-channel low-voltage/low-threshold voltage transistor (P-LV Low Vt) formed in an n-well 88.

The flash memory cell (Flash cell) is a flash EPROM of the stack gate structure and stores required information as charges in the floating gate. The film thickness of the tunnel oxide film is decided independently in accordance with charge retaining characteristics, a life of the oxide film, etc.

The n-channel high-voltage/low-threshold voltage transistor (N-HV Low Vt), the n-channel high-voltage/high-threshold voltage transistor (N-HV High Vt), the p-channel high-voltage/low-threshold voltage transistor (P-HV Low Vt) and the p-channel high-voltage/high-threshold voltage transistor (P-HV High Vt) constitute the flash memory cell control circuit unit 308 and are operative at 5V when the flash memory cell is read and at up to 10V when the flash memory cell is written or erased. The flash memory cell control circuit unit 308 requires thus high voltages, so that the thicknesses of the gate insulating films of these transistors are thick.

The n-channel middle-voltage transistor (N-MV) and the p-channel middle-voltage transistor (P-MV) constitute the input/output circuit unit 204 and are operative at 2.5 V, 3.3 V or others. The 2.5 V operative transistors and the 3.3 V operative transistors are different from each other in the gate insulating film thickness, threshold voltage adjusting conditions, and LDD conditions, but it is not necessary to mount both. Generally, either of them is mounted.

The n-channel low-voltage/high-threshold voltage transistor (N-LV High Vt), the n-channel low-voltage/low-threshold voltage transistor (N-LV Low Vt), the p-channel low-voltage/high-threshold voltage transistor (P-LV High Vt) and the p-channel low-voltage/low-threshold voltage transistor (P-LV Low Vt) constitute the main logic circuit unit 202. Ultra-thin film gate insulating film is used in these transistors for higher performance of the main logic circuit unit 202.

The semiconductor device according to the present embodiment is characterized mainly by the structure of the sidewall spacer. The characteristic of the semiconductor device according to the present embodiment and will be explained by means of the flash memory cell (Flash cell) and the n-channel high-voltage/low-threshold voltage transistor (N-HV Low Vt).

FIG. 3 is a diagrammatic sectional view of the flash memory cell (Flash cell) and the n-channel high-voltage/low-threshold voltage transistor (N-HV Low Vt), which shows their structures. In FIG. 3, the flash memory cell (Flash cell) is shown on the left side, and on the right side, the n-channel high-voltage/low-threshold voltage transistor (N-HV Low Vt) is shown. The flash memory cell (Flash cell) and the n-channel high-voltage/low-threshold voltage transistor (N-HV Low Vt) are formed in a triple well (the p-well 78) as shown in FIG. 2, but in FIG. 3, the p-well 78 is not shown for the convenience of the description.

The n-channel high-voltage/low-threshold voltage transistor (N-HV Low Vt) comprises a gate electrode 118 formed on a silicon substrate 10 with a gate insulating film 104 interposed therebetween, source/drain regions 142 formed in the silicon substrate 10 on both sides of the gate electrode 118. A sidewall spacer 144 of a silicon oxide film is formed on the side wall of the gate electrode 118.

On the other hand, the flash memory cell (Flash cell) comprises a floating gate 58 formed on the silicon substrate 10 with a tunnel oxide film 56 interposed therebetween, a gate electrode (control gate) 112 formed on the floating gate 58 with an ONO film 60 interposed therebetween, and source/drain regions 148 formed in the silicon substrate 10 on both sides of the gate electrode 112. A sidewall spacer 145 of the double layer structure including a sidewall spacer 116 of a silicon oxide film and a sidewall spacer 144 of a silicon nitride film is formed on the side walls of the floating gate 58 and the gate electrode 112. A silicon oxide film 115 is formed between the sidewall spacer 145, and the gate electrode 112, the floating gate 58 and the silicon substrate 10. The film thickness of the silicon oxide film 115 below the sidewall spacer 144 is thinner than the silicon oxide film 115 below the sidewall spacer 116 and is equal to or thinner than a film thickness of a thickest gate insulating film in the peripheral transistors (the gate insulating film 104 in the present embodiment).

As described above, the semiconductor device according to the present embodiment is characterized in that the peripheral transistors constituting the main logic circuit unit 202, the input/output circuit unit 204 and the flash memory cell control circuit 208 have the sidewall spacer 144 formed of the single layer structure of the silicon oxide film, while the flash memory cell has the sidewall spacer formed of the double layer structure including the sidewall spacer 116 of the silicon nitride film and the sidewall spacer 144 of the silicon oxide film, and the film thickness of the silicon oxide film 115 below the sidewall spacer 144 is thinner than the film thickness of the silicon oxide film 115 below the sidewall spacer 116 and is equal to or thinner than the film thickness of the gate insulating film which is thickest in the peripheral transistors.

As described above, the use of the sidewall spacer of the double layer structure as the sidewall spacer of the flash memory cell has often caused defective contacts of the source/drain regions of the flash memory cell. The inventors of the present application have made earnest studies of the defect and found that the defective contact of the source/drain regions of the flash memory cell is due to the absence of silicide film on the source/drain regions of the flash memory cell. It has been found that the absence of silicide film is due to residual silicon oxide film which cannot be removed in the step of etching, etc. as the pre-treatment of the salicide processing.

The silicon oxide film formed on the source/drain regions of the flash memory cell is formed of residual tunnel oxide film, and formed by the following thermal oxidation steps (e.g., of oxidizing the sidewall of the gate electrode) and is usually thicker than the gate insulating film of the peripheral transistors. Accordingly, when the sidewall spacer is formed, etching optimized for conditions for forming the sidewall spacer on the side walls of the gate electrodes of the peripheral transistors often leaves the silicon oxide film in the source/drain regions of the flash memory cell.

On the other hand, when the etching amount is increased so as to completely remove the silicon oxide film on the source/drain regions of the flash memory cell, the peripheral transistors, especially the low-voltage transistors, whose gate insulating film is thinner, are exposed excessively to the etching atmosphere and often have the characteristics degraded.

The semiconductor device according to the present embodiment is constituted so that such problem can be solved. To this end, the film thickness of the silicon oxide film 115 is thinner below the sidewall spacer 144 than below the sidewall spacer 116, and is equal or thinner than a largest film thickness of the gate insulating film of the peripheral transistors.

Then, the above-described characteristics of the semiconductor device according to the present embodiment will be explained with reference to FIGS. 4A-22C in connection with the method for fabricating the semiconductor device according to the present embodiment. FIGS. 4A to 19 are sectional views of the semiconductor device according to the present embodiment in the steps of the method for fabricating the same, which show the method. FIGS. 20A to 22C are sectional views detailing the forming steps of the sidewall spacers. The flash memory cell (Flash cell) and the n-channel high-voltage/low-threshold voltage transistors (N-HV Low Vt) are formed in a triple well (the p-well 78), but the triple well is omitted for the convenience of the description in FIGS. 20A to 22C, as is in FIG. 3.

In the following description, the wording "the n-channel transistors" includes the n-channel high-voltage/high-threshold voltage transistor (N-HV High Vt), the n-channel high-voltage/low-threshold voltage transistor (N-HV Low Vt), the n-channel middle-voltage transistor (N-MV), the n-channel low-voltage/high-threshold voltage transistor (N-LV High Vt) and the n-channel low-voltage/low-threshold voltage transistor (N-LV Low Vt). The wording "the p-channel transistors" includes the p-channel high-voltage/high-threshold voltage transistor (P-HV High Vt), the p-channel high-voltage/low-threshold voltage transistor (P-HV Low Vt), the p-channel middle-voltage transistor (P-MV), the p-channel low-voltage/high-threshold voltage transistor (P-LV High Vt) and the p-channel low-voltage/low threshold voltage transistor (P-LV Low Vt). The n-channel transistors often include the flash memory cell (Flash cell).

The wording "the high-voltage transistors" includes the n-channel high-voltage/low-threshold voltage transistor (N-HV Low Vt), the n-channel high-voltage/high-threshold voltage transistor (N-HV High Vt), the p-channel high-voltage/low-threshold voltage transistor (P-HV Low Vt) and the p-channel high-voltage/high-threshold voltage transistor (P-HV High Vt). The wording "the middle-voltage transistors" includes the n-channel middle-voltage transistor (N-MV) and the p-channel middle-voltage transistor (P-MV). The wording "the low-voltage transistors" includes the n-channel low-voltage/high-threshold voltage transistor (N-LV High Vt), the n-channel low-voltage/low-threshold voltage transistor (N-LV Low Vt), the p-channel low-voltage/high-threshold voltage transistor (P-LV High Vt) and the p-channel low-voltage/low-threshold voltage transistor (P-LV Low Vt). The high-voltage transistors often include the flash memory cell (Flash cell).

The wording "n-channel high-voltage transistors" includes the n-channel high-voltage/low-threshold voltage transistor (N-HV Low Vt) and the n-channel high-voltage/high-threshold voltage transistor (N-HV High Vt) The wording "the p-channel high-voltage transistor" includes the p-channel high-voltage/low-threshold voltage transistor (P-HV Low Vt) and the p-channel high-voltage/high-threshold voltage transistor (P-HV High Vt). The wording "the n-channel low-voltage transistors" includes the n-channel low-voltage/high-threshold voltage transistor (N-LV High Vt) and the n-channel low-voltage/low-threshold voltage transistor (N-LV Low Vt). The wording "the p-channel low-voltage transistors" includes the p-channel low-voltage/high-threshold voltage transistor (P-LV High Vt) and the p-channel low-voltage/low-threshold voltage transistor (P-LV Low Vt).

Figure 4A:
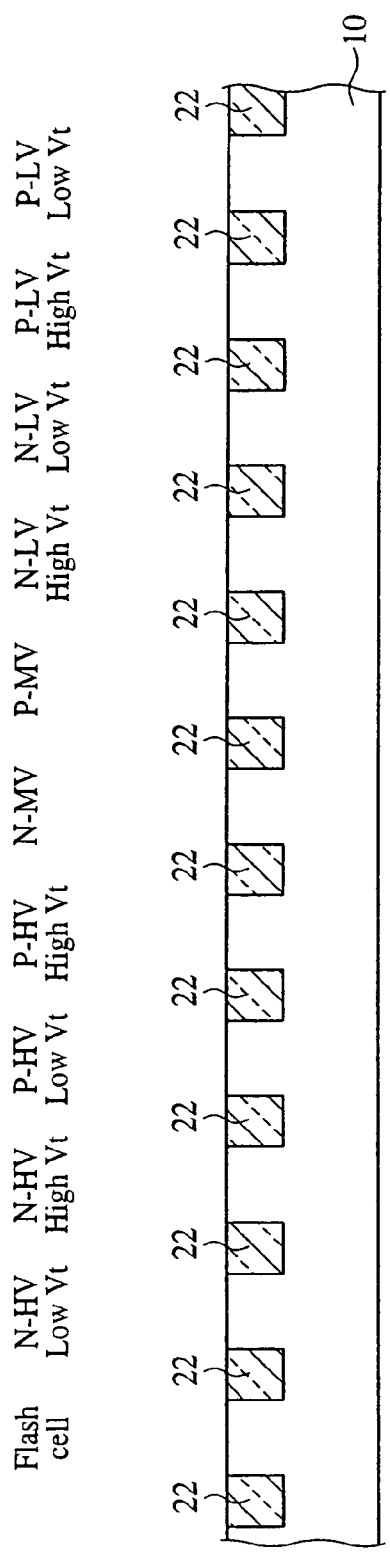

First, a device isolation film 22 for defining active regions is formed on the silicon substrate 10 by, e.g., STI (Shallow Trench Isolation) method (FIG. 4A). First, a silicon oxide film of, e.g., a 10 nm-thick is formed by thermal oxidation. Next, a silicon nitride film of, e.g., a 100 nm-thick is grown by CVD method. Then, the silicon nitride film, the silicon oxide film and silicon substrate 10 are sequentially etched by lithography and dry etching to form a groove of, e.g., a 300 nm-depth. Then, the silicon substrate 10 is thermally oxidized to form a silicon oxide film on the inside surface of the groove. Next, a silicon oxide film of, e.g., a 550 nm-thick is grown by, e.g., high-density plasma CVD method. Then, the silicon oxide film is planarized until the silicon nitride film is exposed to form the device isolation film 22 of the silicon oxide film buried in the groove.

In FIG. 4A, the active regions defined by the device isolation film 22 are sequentially from the left a flash memory cell (Flash cell) forming region, an n-channel high-voltage/low-threshold voltage transistor (N-HV Low Vt) forming region, an n-channel high-voltage/high-threshold voltage transistor (N-HV High Vt) forming region, a p-channel high-voltage/low-threshold voltage transistor (P-HV Low Vt) forming region, a p-channel high-voltage/high-threshold voltage transistor (P-HV High Vt) forming region, an n-channel middle-voltage transistor (N-MV) forming region, a p-channel middle-voltage transistor (P-MV) forming region, an n-channel low-voltage/high threshold voltage transistor (N-LV High Vt) forming region, an n-channel low-voltage/low threshold voltage transistor (N-LV Low Vt) forming region, a p-channel low-voltage/high-threshold voltage transistor (P-LV High Vt) forming region, and a p-channel low-voltage/low-threshold voltage transistor (P-LV Low Vt) forming region.

Then, the silicon nitride film and the silicon oxide film used in forming the device isolation film 22 is removed, and then the silicon substrate 10 is thermally oxidized to grow a silicon oxide film 24 as a sacrificial oxide film of, e.g., a 10 nm-thick.

Next, a photoresist film 26 exposing the flash memory cell (Flash cell) forming region and the n-channel high-voltage transistors (N-HV High Vt, N-HV Low Vt) forming regions and covering the other regions is formed by photolithography.

Figure 4B:
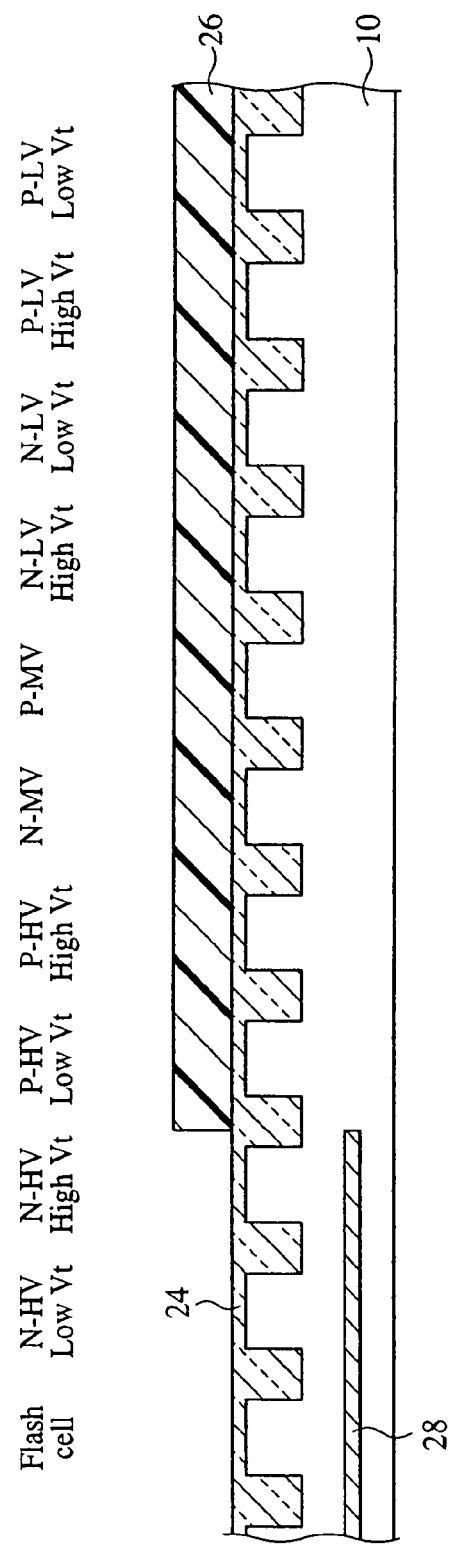

Then, donor ions are implanted with the photoresist film 26 as the mask to form an n-type buried diffused layer 28 in the flash memory cell (Flash cell) forming region and the n-channel high-voltage transistors (N-HV High Vt, N-HV Low Vt) forming regions (FIG. 4B). The n-type buried diffused region 28 is formed by implanting, e.g., phosphorus ions (P+) under conditions of a 2 MeV acceleration energy and a $2 \times 10^{13}$ cm$^{-2}$ dosage.

Next, the photoresist film 26 is removed by, e.g., ashing.

Then, a photoresist film 30 exposing the flash memory cell (Flash cell) forming region, the n-channel middle-voltage transistor (N-MV) forming region, and the n-channel low-voltage transistors (N-LV High Vt, N-LV Low Vt) forming regions and covering the other regions is formed by photolithography.

Figure 5A:
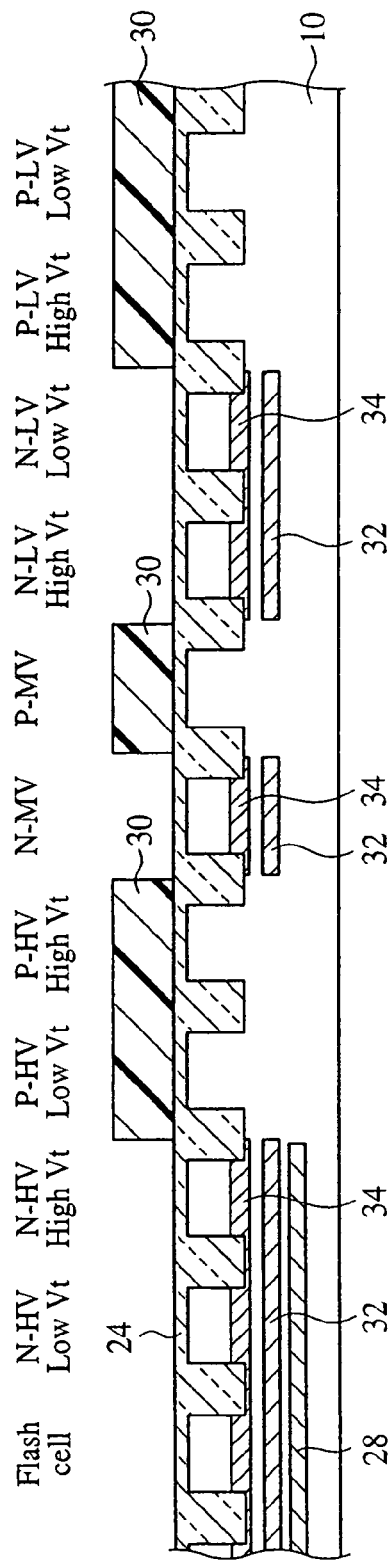

Then, acceptor ions are implanted with the photoresist film 30 as the mask to form impurity diffused layers 32, 34 for the p-wells in the flash memory cell (Flash cell) forming region, the n-channel middle-voltage transistor (N-MV) forming region, and the n-channel low-voltage transistors (N-LV High Vt, N-LV Low Vt) forming regions (FIG. 5A). The impurity diffused layers 34 for the p-wells are formed by e.g., implanting boron ions (B+) under conditions of a 420 keV acceleration energy and a $1.4 \times 10^{13}$ cm$^{-2}$ dosage. The impurity diffused layers 34 for the p-wells are formed by e.g., implanting boron ions under conditions of a 100 keV acceleration energy and a $3.6 \times 10^{12}$ cm$^{-2}$ dosage.

Next, the photoresist film 30 is removed by, e.g., ashing.

Next, a photoresist film 36 exposing the n-channel high-voltage/high threshold voltage transistor (N-HV High Vt) forming region, the n-channel middle-voltage transistor (N-MV) forming region, and the n-channel low-voltage transistors (N-LV High Vt, N-LV Low Vt) forming regions and covering the other regions is formed by photolithography.

Figure 5B:
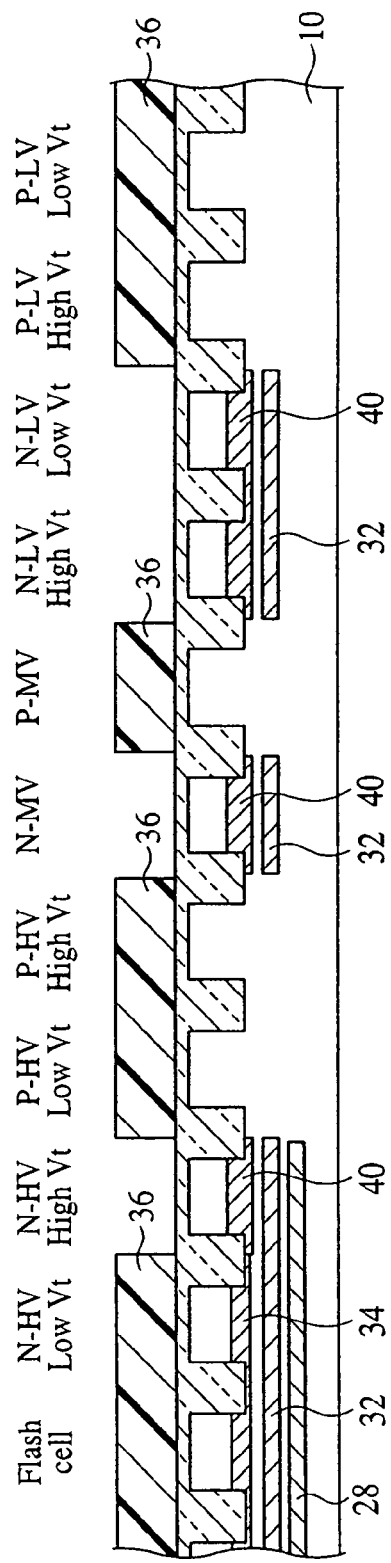

Then, acceptor ions are implanted with the photoresist film 36 as the mask to form an impurity diffused layers 40 for the p-wells in the n-channel high-voltage/high-threshold voltage transistor (N-HV High Vt) forming region, the n-channel middle-voltage transistor (N-MV) forming region, and the n-channel low-voltage transistors (N-LV High Vt, N-LV Low Vt) forming regions (FIG. 5B). The impurity diffused layers 40 for the p-wells are formed by e.g., implanting boron ions under conditions of a 100 keV acceleration energy and a $4 \times 10^{12}$ cm$^{-2}$ dosage.

Next, the photoresist film 36 is removed by, e.g., ashing.

Then, a photoresist film 42 exposing the p-channel high-voltage transistors (P-HV Low Vt, P-HV High Vt) forming regions, the p-channel middle-voltage transistor (P-MV) forming region, and the p-channel low-voltage transistors (P-LV High Vt, P-LV Low Vt) forming regions and covering the other regions is formed by photolithography.

Figure 6A:
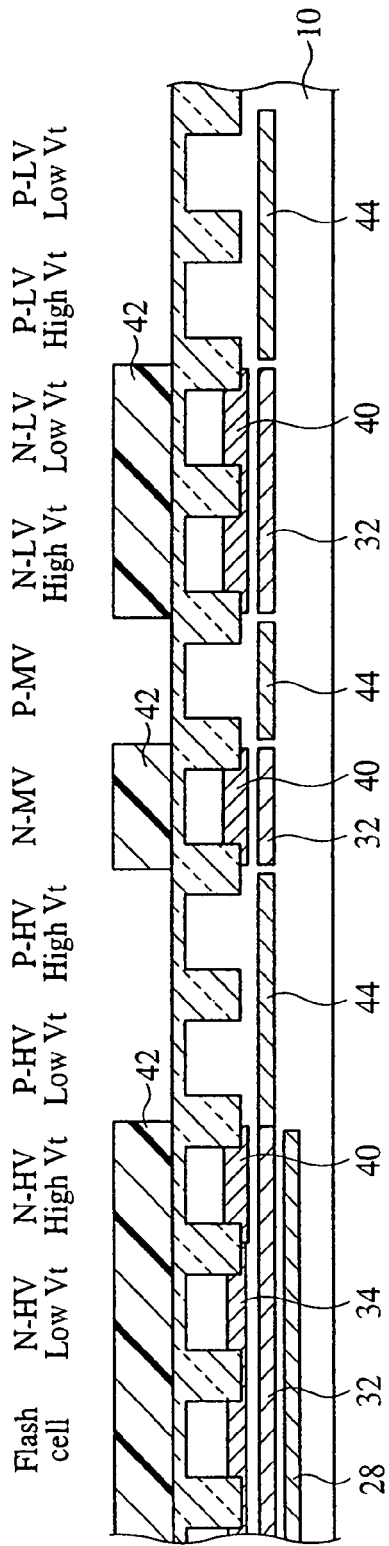

Next, with the photoresist film 42 as the mask, donor ions are implanted to form an impurity diffused layers 44 for the n-wells in the p-channel high-voltage transistors (P-HV Low Vt, P-HV High Vt) forming regions, the p-channel middle-voltage transistor (P-MV) forming region, and the p-channel low-voltage transistor (P-LV High Vt, P-LV Low Vt) forming regions (FIG. 6A). The impurity diffused layers 44 for the n-wells are formed by, e.g., implanting phosphorus ions under conditions of at a 600 keV acceleration energy and a $1.5 \times 10^{13}$ cm$^{-2}$ dosage and at a 240 keV acceleration energy and a $9.0 \times 10^{11}$ cm$^{-2}$ dosage. Under these conditions, the p-channel high-voltage/low-threshold voltage transistor (p-HV Low Vt) of an about −0.2 V threshold voltage can be produced.

Then, the photoresist film 42 is removed by, e.g., ashing.

Next, a photoresist film 46 exposing the p-channel high-voltage/high-threshold voltage transistor (P-HV High Vt) forming region, the p-channel middle-voltage transistor (P-MV) forming region, and the p-channel low-voltage transistors (P-LV High Vt, P-LV Low Vt) forming regions and covering the other regions is formed by photolithography.

Figure 6B:
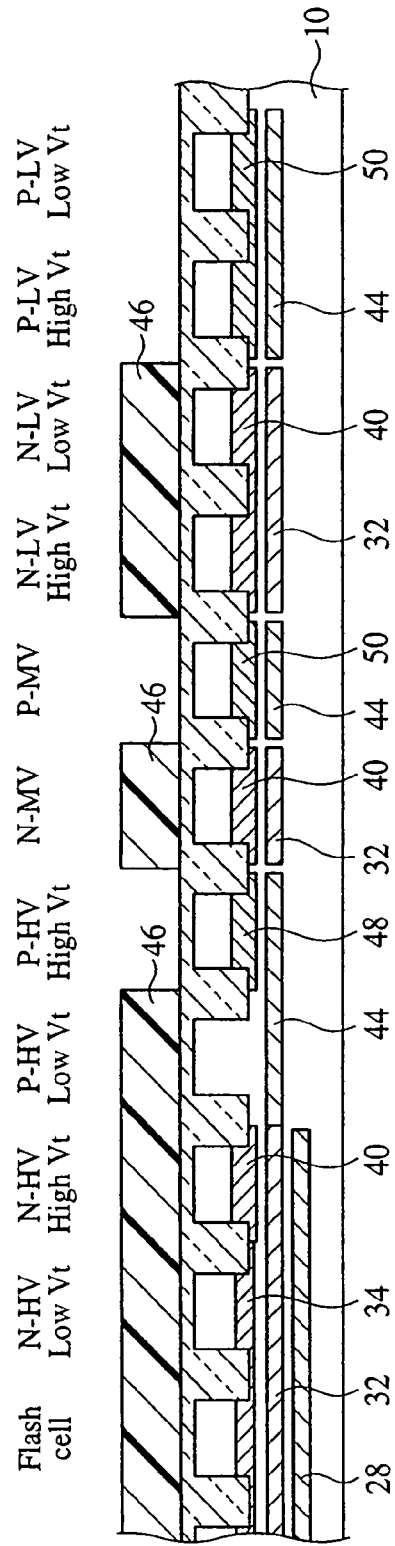

Then, donor ions are implanted with the photoresist film 46 as the mask to form an impurity diffused layer 48 for adjusting the threshold voltage in the p-channel high-voltage/high-threshold voltage transistor (P-HV High Vt) forming region, and a channel stop layer 50 in the p-channel middle-voltage transistor (P-MV) forming region and the p-channel low-voltage transistors (P-LV High Vt, P-LV Low Vt) forming regions (FIG. 6B). The impurity diffused layer 48 for adjusting the threshold voltage and the channel stop layer 50 are formed by, e.g., implanting phosphorus ions under conditions of a 240 keV acceleration energy and a $3.6 \times 10^{12}$ cm$^{-2}$ dosage. Under these conditions, the p-channel high-voltage/high-threshold voltage transistor (P-HV High Vt) of an about −0.6 V threshold voltage can be produced.

Then, the photoresist film 46 is removed by, e.g., ashing.

Next, a photoresist film 52 exposing the flash memory (Flash cell) forming region and covering the other regions is formed by photolithography.

Figure 7A:
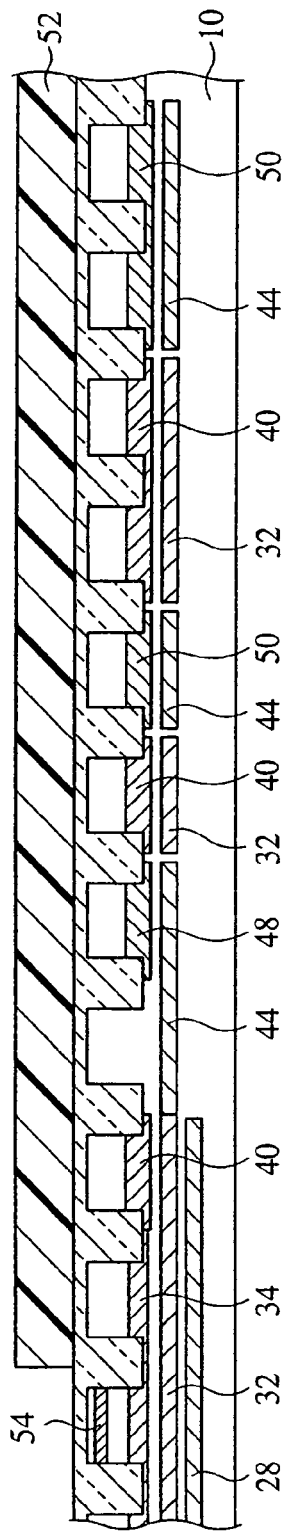

Next, acceptor ions are implanted with the photoresist film 52 as the mask to form an impurity diffused layer 54 for adjusting the threshold voltage in the flash memory cell (Flash cell) forming region (FIG. 7A). The impurity diffused layer 54 for adjusting the threshold voltage is formed by, e.g., implanting boron ions under conditions of at a 40 keV acceleration energy and a $6 \times 10^{13}$ cm$^{-2}$ dosage.

Then, the photoresist film 52 is removed by, e.g., ashing.

Figure 7B:
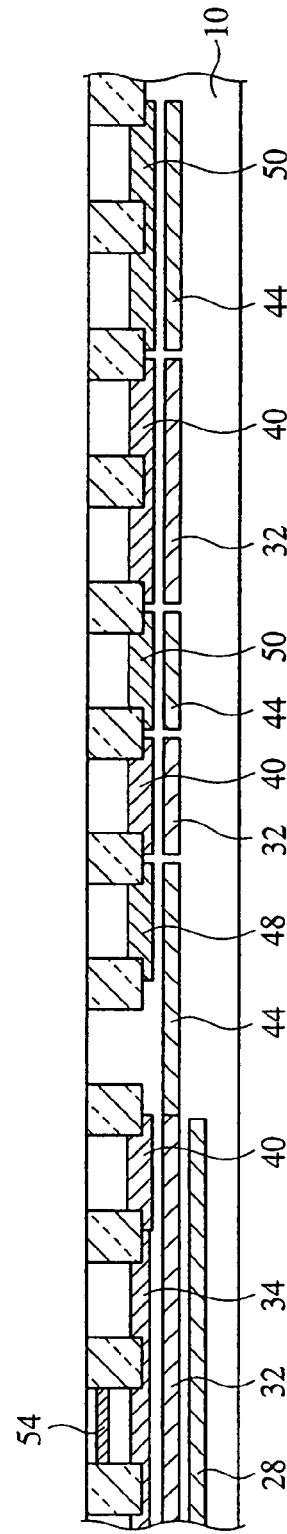

Next, the silicon oxide film 24 as the sacrificial oxide film is removed by a hydrofluoric acid aqueous solution (FIG. 7B).

Then, thermal oxidation of, e.g., 900-1050° C. is performed for 30 minutes to form a 10 nm-thick tunnel oxide film 56 on the active regions.

Next, a polycrystalline silicon film of, e.g., 90 nm-thick is formed on the tunnel oxide film 56 by, e.g., CVD method.

Then, the polycrystalline silicon film is patterned by photolithography and dry etching to form the floating gate 58 of the polycrystalline silicon film in the flash memory cell (Flash cell) forming region.

Next, a silicon oxide film of, e.g., a 5 nm-thick and a silicon nitride film of, e.g., a 8 nm-thick are formed by, e.g., CVD method on the tunnel oxide film 56 with the floating gate 58 formed on. Then, the surface of the silicon nitride film is thermally oxidized at 950° C. for 90 minutes to grow an about 6 nm-thick silicon oxide film. Thus, an ONO film 60 of the silicon oxide film/silicon nitride film/silicon oxide film structure is formed (FIG. 8A).

Then, a photoresist film 70 exposing the n-channel low-voltage/high-threshold voltage transistor (N-LV High Vt) forming region and covering the other regions is formed by photolithography.

Then, acceptor ions are implanted with the photoresist film 70 as the mask to form an impurity diffused layer 72 for adjusting the threshold voltage in the n-channel low-voltage/high-threshold voltage transistor (N-LV High Vt) forming region (FIG. 8B). The impurity diffused layer 72 for adjusting the threshold voltage is formed by, e.g., implanting boron ions under conditions of a 15 keV acceleration energy and a 7×1012 cm-2 dosage, and an about +0.2 V threshold voltage is obtained.

Next, the photoresist film 70 is removed by, e.g., ashing.

Next, a photoresist film 74 exposing the p-channel low-voltage/high-threshold voltage transistor (P-LV High Vt) forming region and covering the other regions is formed by photolithography.

Figure 9A:
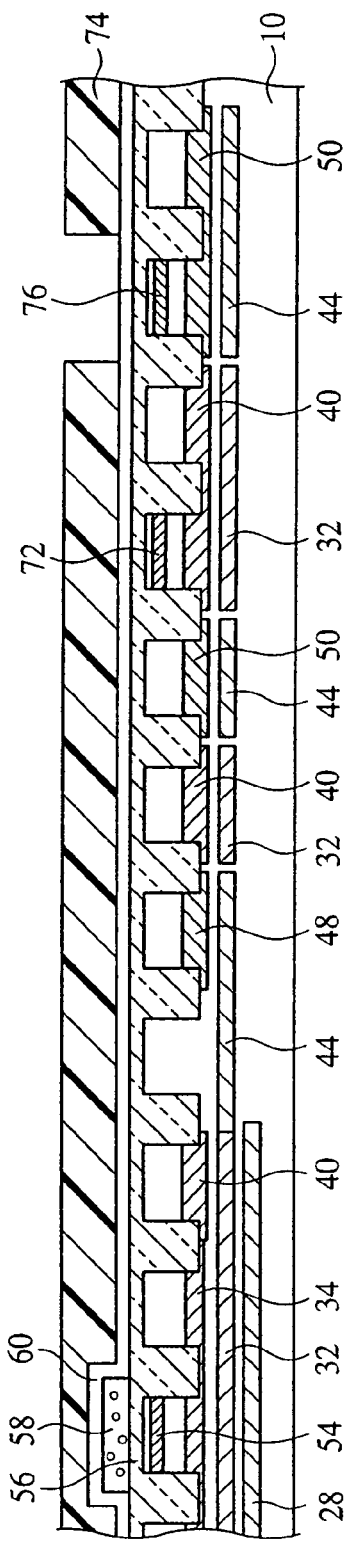

Then, donor ions are implanted with the photoresist film 74 as the mask to form an impurity diffused layer 76 for adjusting the threshold voltage in the p-channel low-voltage/high-threshold voltage transistor (P-LV High Vt) forming region (FIG. 9A). The impurity diffused layer 76 for adjusting the threshold voltage is formed by, e.g., implanting arsenic ions under conditions of a 150 keV acceleration energy and a 6×1012 cm-2 dosage, and an about −0.2 V threshold voltage is obtained.

Next, the photoresist film 74 is removed by, e.g., ashing.

Next, a photoresist film 62 exposing the n-channel middle-voltage transistor (N-MV) forming region and covering the other regions is formed by photolithography.

Figure 9B:
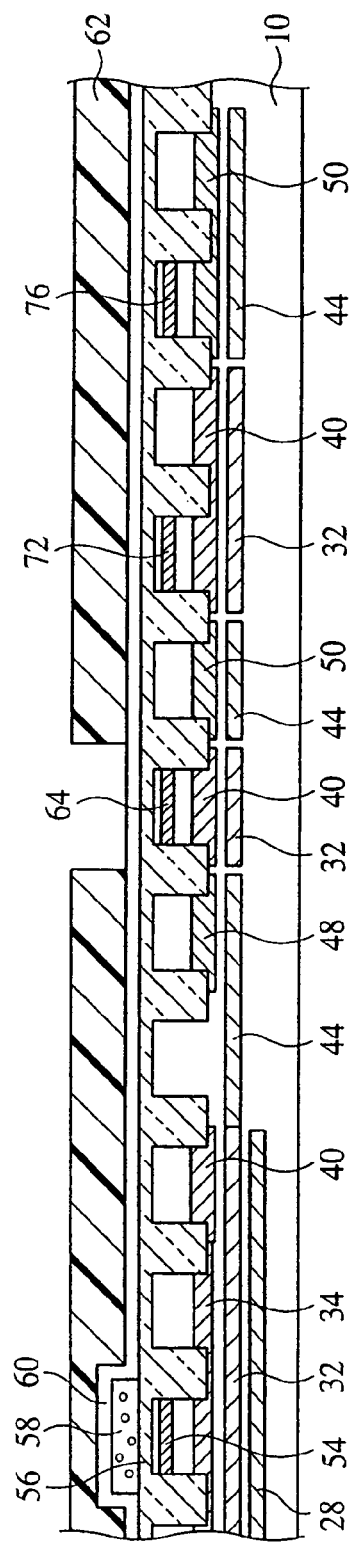

Then, acceptor ions are implanted with the photoresist film 62 as the mask to form an impurity diffused layer 64 for adjusting the threshold voltage in the n-channel middle-voltage transistor (N-MV) forming region (FIG. 9B). The impurity diffused layer 64 for adjusting the threshold voltage is formed by, e.g., implanting boron ions under conditions of a 35 keV acceleration energy and a 4.5×1012 cm-2 dosage, and an about +0.3~+0.4V threshold voltage is obtained.

Then, the photoresist film 62 is removed by, e.g., ashing.

Next, a photoresist film 66 exposing the p-channel middle-voltage transistor (P-MV) forming region and covering the other regions is formed by photolithography.

Figures 10A, 10B:
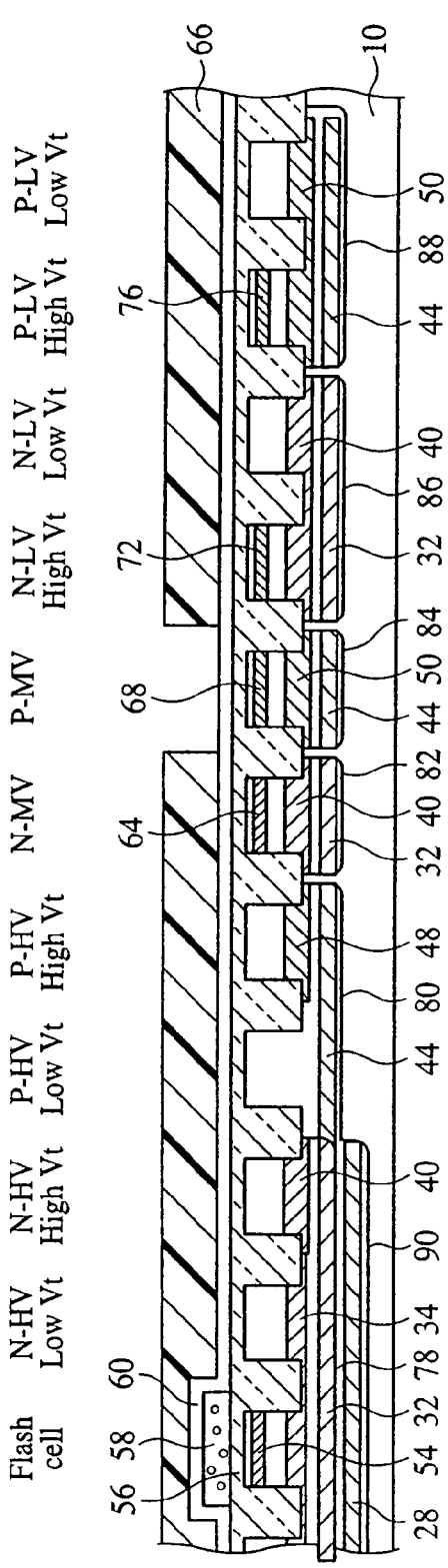

Then, with the photoresist film 66 as the mask, donor ions are implanted to form an impurity diffused layer 68 for adjusting the threshold voltage in the p-channel middle-voltage transistor (P-MV) forming region (FIG. 10A). The impurity diffused layer 68 for adjusting the threshold voltage is formed by, e.g., implanting arsenic (As+) ions under conditions of a 150 keV acceleration energy and a 2×1012 cm-2, and an about −0.3~−0.4 V threshold voltage is obtained.

Then, the photoresist film 66 is removed by, e.g., ashing.

Thus are formed the p-well 78 including the impurity diffused layers 32, 34, 40 for the p-wells and the impurity diffused layer 54 for adjusting the threshold voltage and formed in the flash memory cell (Flash cell) forming region and the n-channel high-voltage transistors (N-HV Low Vt, N-HV High Vt) forming regions; the n-well 80 including impurity diffused layers 44, 48 for n-wells and the impurity diffused layer 58 for adjusting the threshold voltage and formed in the p-channel high-voltage transistors (P-HV Low Vt, P-HV High Vt) forming regions; the p-well 82 including the impurity diffused layers 32, 40 for p-wells and formed in the n-channel middle-voltage transistor (N-MV) forming region; the n-well 84 including the impurity diffused layer 44 for n-wells, the channel stop layer 50 and the impurity diffused layer 68 for adjusting the threshold voltage and formed in the p-channel middle-voltage transistor (P-MV) forming region; the p-well 86 including the impurity diffused layers 32, 34, 40 for the p-wells and the impurity diffused layer 72 for adjusting the threshold voltage and formed in the n-channel low-voltage transistors (N-LV High Vt, N-LV Low Vt) forming regions; and the n-well 88 including the impurity diffused layer 44 for the n-well, the channel stop layer 50 and the impurity diffused layer 76 for adjusting the threshold voltage and formed in the p-channel low-voltage transistors (P-LV High Vt, P-LV Low Vt) forming regions. The n-well 80 functions not only as the n-type buried diffused layer 28 but also as the n-well 90 surrounding the p-well 78. That is, the p-well 78 is a double well formed in the n-well 90 (see FIG. 10A).

Then, a photoresist film 92 covering the flash memory cell (Flash cell) forming region and exposing the other regions is formed by photolithography.

Next, with the photoresist film 92 as the mask, the ONO film 60 is etched by, e.g., dry etching, and the ONO film except in the flash memory cell (Flash cell) forming region is removed.

Then, the tunnel oxide film 56 except in the flash memory cell (Flash cell) forming region is etched with the photoresist film 92 as the mask by wet etching using, e.g., a hydrofluoric acid aqueous solution (FIG. 10B).

Next, the photoresist film 92 is removed by, e.g., ashing.

Then, thermal oxidation is performed at 850° C. to form a 12 nm-thick silicon oxide film 94 on the active regions.

Next, a photoresist film 96 covering the flash memory cell (Flash cell) forming region and the high-voltage transistors (N-HV Low Vt, N-HV High Vt, P-HV Low Vt, P-HV High Vt) forming regions and exposing the other regions is formed by photolithography.

Figure 11A:
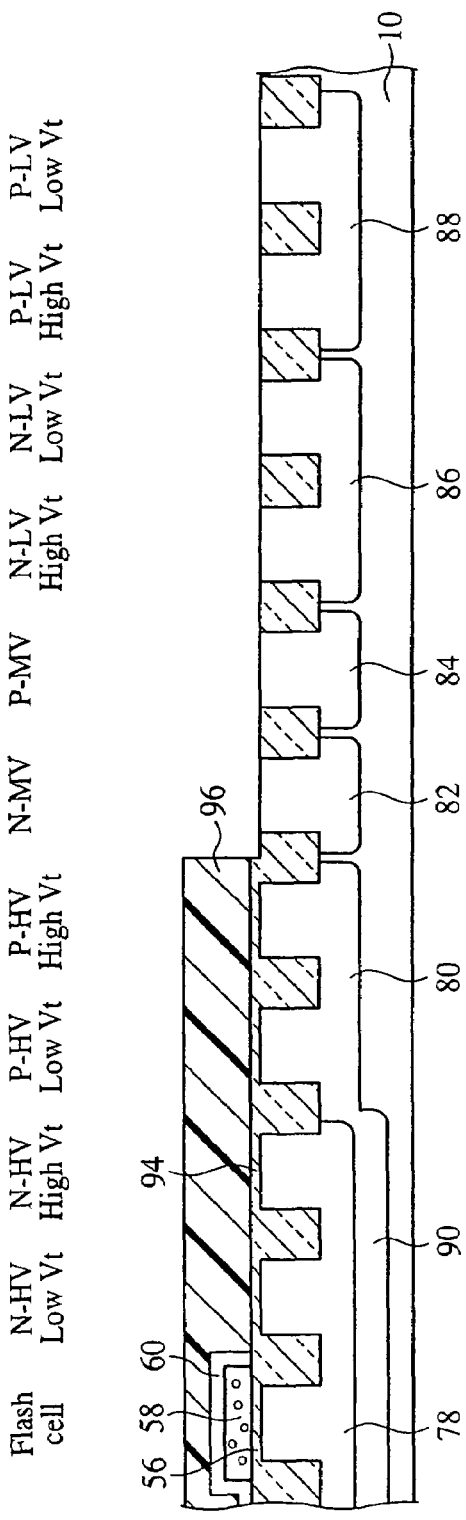

Next, the silicon oxide film 94 is etched with the photoresist film 96 as the mask by wet etching using, e.g., a hydrofluoric acid aqueous solution to remove the silicon oxide film 94 in the middle-voltage transistor (N-MV, P-MV) forming regions and the low-voltage transistors (N-LV Low Vt, N-LV High Vt, P-LV Low Vt, P-LV High Vt) forming regions (FIG. 11A).

Next, the photo resist film 96 is removed by, e.g., ashing.

Then, thermal oxidation is performed at, e.g., 850° C. to form a 7 nm-thick silicon oxide film 98 on the active regions of the middle-voltage transistors (N-MV, P-MV) forming regions and the low-voltage transistors (N-LV Low Vt, N-LV High Vt, P-LV Low Vt, P-LV High Vt) forming regions. In this thermal oxidation step, the film thickness of the silicon oxide film 94 is increased.

Next, a photoresist film covering the flash memory cell (Flash cell) forming region, the high-voltage transistors (N-HV Low Vt, N-HV High Vt, P-HV Low Vt, P-HV High Vt) forming regions and the middle-voltage transistors (N-MV, P-MV) forming regions and exposing the low-voltage transistors (N-LV Low Vt, N-LV High Vt, P-LV Low VT, P-LV High Vt) forming regions is formed by photolithography.

Figure 11B:
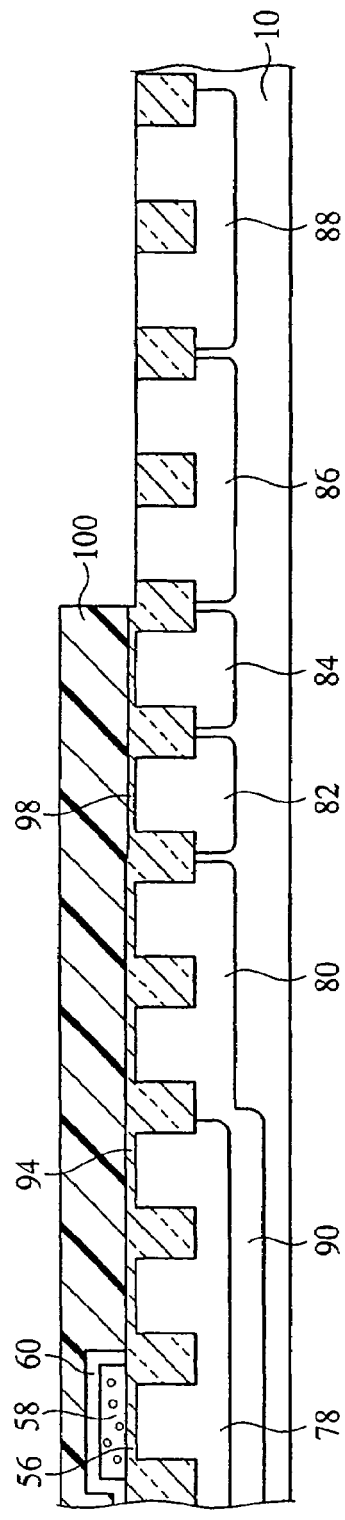

Next, the silicon oxide film 98 is etched with the photoresist film 100 as the mask by wet etching using, e.g., a hydrofluoric acid aqueous solution to remove the silicon oxide film 98 in the low-voltage transistors (N-LV Low Vt, N-LV High Vt, P-LV Low Vt, P-LV High Vt) forming regions (FIG. 11B).

Next, the photoresist film 100 is removed by, e.g., ashing.

Figure 12A:
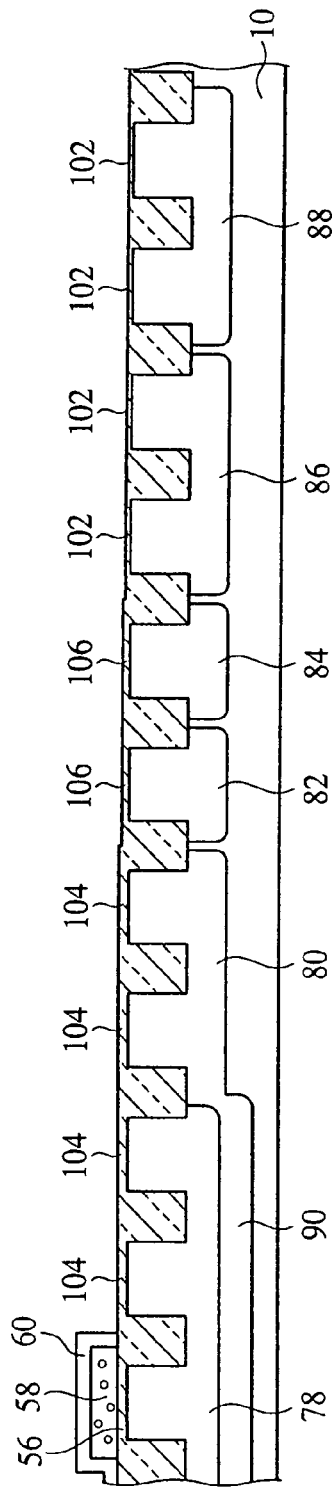

Then, thermal oxidation is performed at, e.g., 850° C. to form the gate insulating film 102 of a 2.2 nm-thick silicon oxide film on the active regions of the low-voltage transistors (N-LV Low Vt, N-LV High Vt, P-LV Low Vt, P-LV High Vt) forming regions. In this thermal oxidation step, the film thicknesses of the silicon oxide films 94, 98 are also increased. In the high-voltage transistors (N-HV Low Vt, N-HV High Vt, P-HV Low Vt, P-HV High Vt) forming regions, the gate insulating film 104 of a 16 nm-total film thickness is formed, and the gate insulating film 106 of a 7.5 nm-total film thickness is formed in the middle-voltage transistors (N-MV, P-MV) forming regions (FIG. 12A).

Then, the polycrystalline silicon film 108 of, e.g., a 180 nm-thick is grown by CVD method.

Next, the silicon nitride film 110 of, e.g., a 30 nm-thick is grown on the polycrystalline silicon film 108 by plasma CVD method. The silicon nitride film 110 functions as the antireflection film and the etching mask in patterning the lower polycrystalline silicon film 108 and also functions to protect the gate electrode of the logic circuit portion in oxidizing the side surfaces of the gate electrode of the flash cell, which will be described later.

Figure 12B:
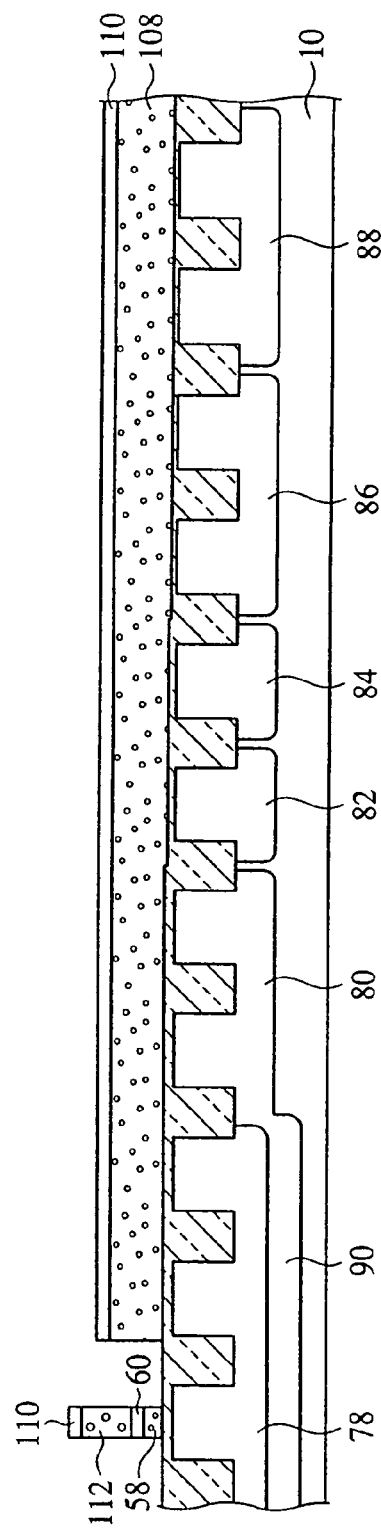

Then, the silicon nitride film 110, the polycrystalline silicon film 108, the ONO film 60 and the floating gate 58 in the flash memory cell (Flash cell) forming region are patterned by photolithography and dry etching to form the gate electrode 112, etc. of the flash memory cell (Flash cell), which are formed of the polycrystalline silicon film 108 (FIG. 12B).

Figure 20A:
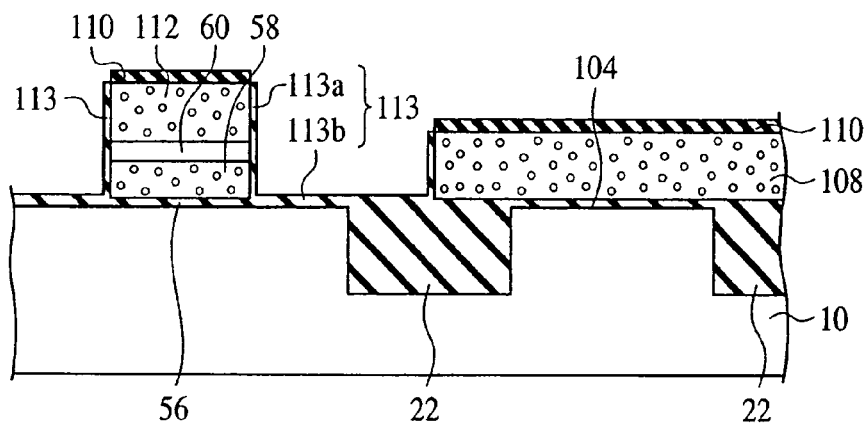

Then, thermal oxidation corresponding to about 10 nm-thick is performed to form the silicon oxide film 113a on the side walls of the gate electrode 112 and the floating gate 58 of the flash memory cell (Flash cell) and the silicon oxide film 113b on the active regions. The film thickness of the silicon oxide film 113b on the active regions is larger than the thickness of the actual oxidized thickness because of the residual tunnel oxide film 56 on the active regions (FIG. 20A).

Figure 20B:
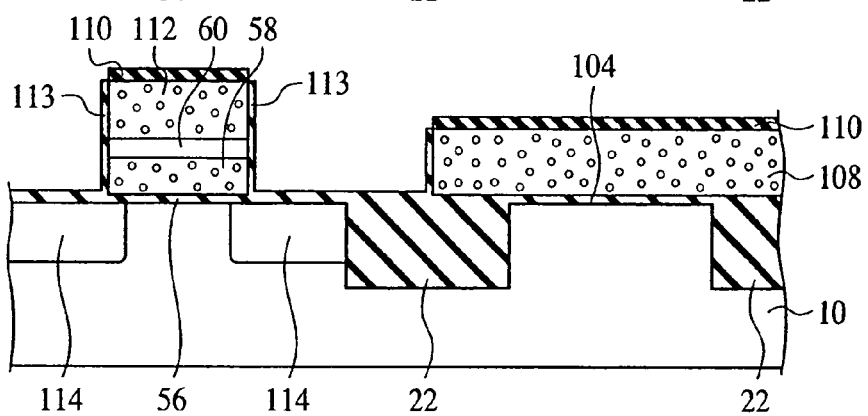

Next, with the gate electrode 112 as the mask, ions are implanted to form the source/drain regions 114 in the silicon substrate 10 on both sides of the gate electrode 112 (FIG. 20B). The source/drain regions 114 are formed by, e.g., implanting arsenic ions under conditions of a 50 keV acceleration energy and a 6.0×1014 cm-2 dosage.

The silicon oxide film 113b on the active regions functions as the protection film for the silicon substrate 10. The residual tunnel oxide film 56 may be present on the active regions, but the film thickness of the residual tunnel oxide film 56 is not uniform. The silicon substrate 10 may be exposed. The silicon oxide film 113b is formed by the additional oxidation, whereby the ion implantation can be performed with the silicon substrate 10 being covered without failure.

Figure 20C:
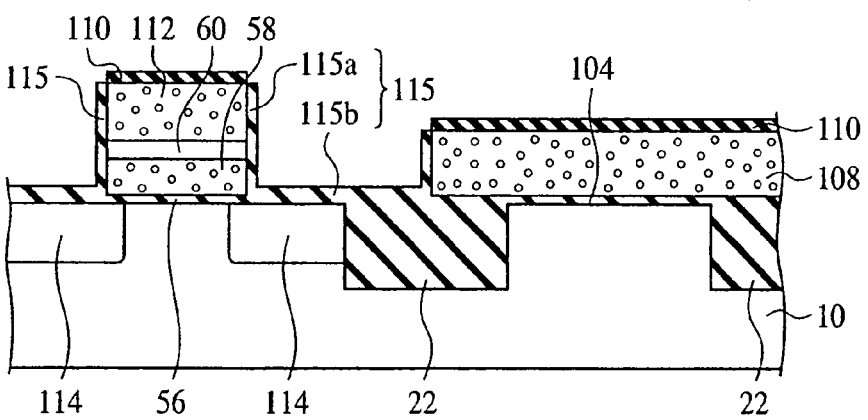

Then, thermal oxidation corresponding to about 9.5 nm-thick is again performed to form the silicon oxide film 115a on the side walls of the gate electrode 112 and the floating gate 58 of the flash memory cell (Flash cell) and the silicon oxide film 115b on the active regions (FIG. 20C).

The silicon oxide films 113a, 115a are formed on the side walls of the gate electrode 112 and the floating gate 58 in the steps of FIGS. 20A and 20C so as to improve the charge retaining characteristics of the flash memory cell (Flash cell).

Figure 20D:
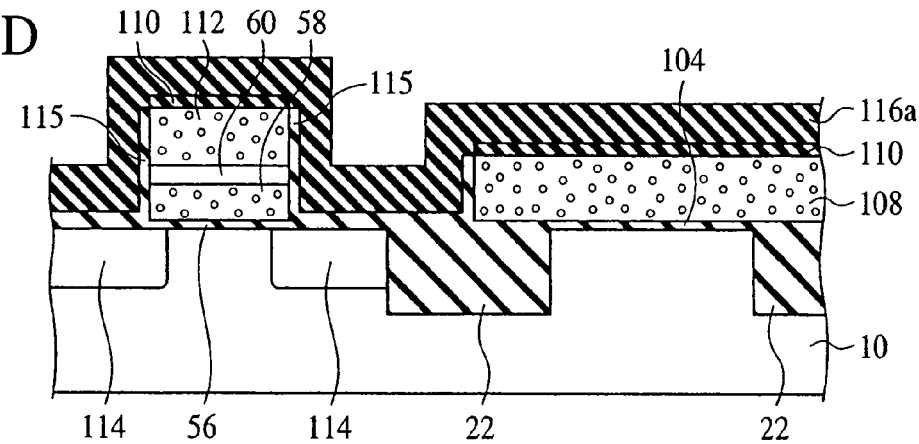

Next, the silicon nitride film 116a of, e.g., a 115 mm-thick is deposited on the entire surface by, e.g., thermal CVD method (FIG. 20D).

Figure 21A:
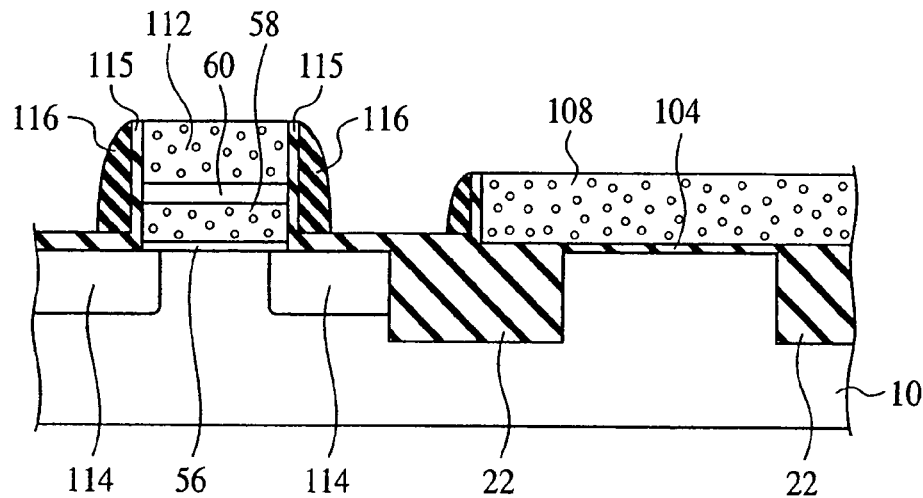

Then, the silicon nitride film 116a and the silicon nitride film 110 are etched back to form the sidewall spacer 116 of the silicon nitride film 116a on the side walls of the gate electrode 112 (FIG. 21A). At this time, the silicon nitride films 116a, 110 are etched with a high selective ratio (e.g., a selective ratio of 20-30 to the silicon oxide film). By using the high selective ration, the silicon oxide film 115 is not substantially etched, whereby the formation of a cavity between the gate electrode 112 and the sidewall spacer 116 can be prevented.

Figure 21B:
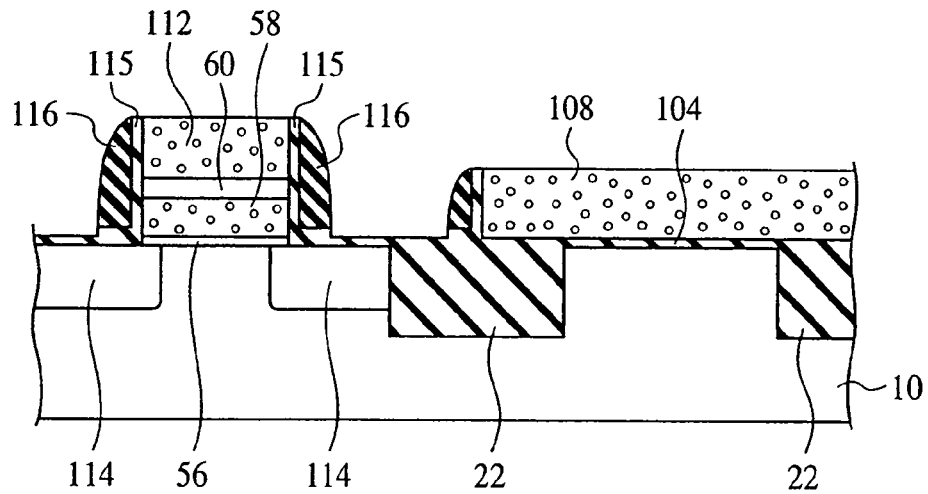

Next, by wet etching using, e.g., a hydrofluoric acid aqueous solution, the silicon oxide film 115 is etched to about 6 nm-thick in terms of the thermal oxidation film on the silicon substrate. This etching forms at the end of the sidewall spacer 116 on the silicon oxide film 115b a step corresponding to the etching amount (FIG. 21B).

In this etching, the etching amount is decided so that the residual silicon oxide film 115 has a thickness equal to or thinner than a film thickness of the thickest gate insulating film of the peripheral transistor (the gate insulating film 104 of a 16 nm-thick in the present embodiment). Reasons for thus setting the etching amount will be described later.

When the silicon oxide film 115 is etched, a cavity is formed between the gate electrode 112 and the sidewall spacer 116. There is a risk that the cavity which is deep may affect the characteristics of the flash memory cell (Flash cell). An excessive etching amount of the silicon oxide film 115 is not preferable. Preferably, the upper limit of the etching amount of the silicon oxide film is set at a minimum etching amount which permits the residual film to have a film thickness thinner than a film thickness of the thickest gate insulating film in the peripheral transistor even in consideration of a fluctuation of the thickness of the silicon oxide film 115b.

The inventors of the present application have investigated the thickness of the silicon oxide film 115 on the active regions. The film thickness was about 20 nm. When the silicon oxide film 115 is etched by 6 nm, the residual film is 14 nm, and can be thinner than the thickest gate insulating film 104 (of a 16 nm-thick) in the peripheral transistor. Even when the film thickness of the silicon oxide film 115b is disuniformly thicker by 10%, the residual film is 16 nm, which is substantially equal to the film thickness of the gate insulating film 104.

It is preferable that the silicon oxide film 115 is etched by wet etching. When the gate electrode 112 and the polycrystalline silicon film 108 are exposed to excessive dry etching, there is a risk that the surfaces may be roughened. In view of this, wet etching is preferable.

Figure 13A:
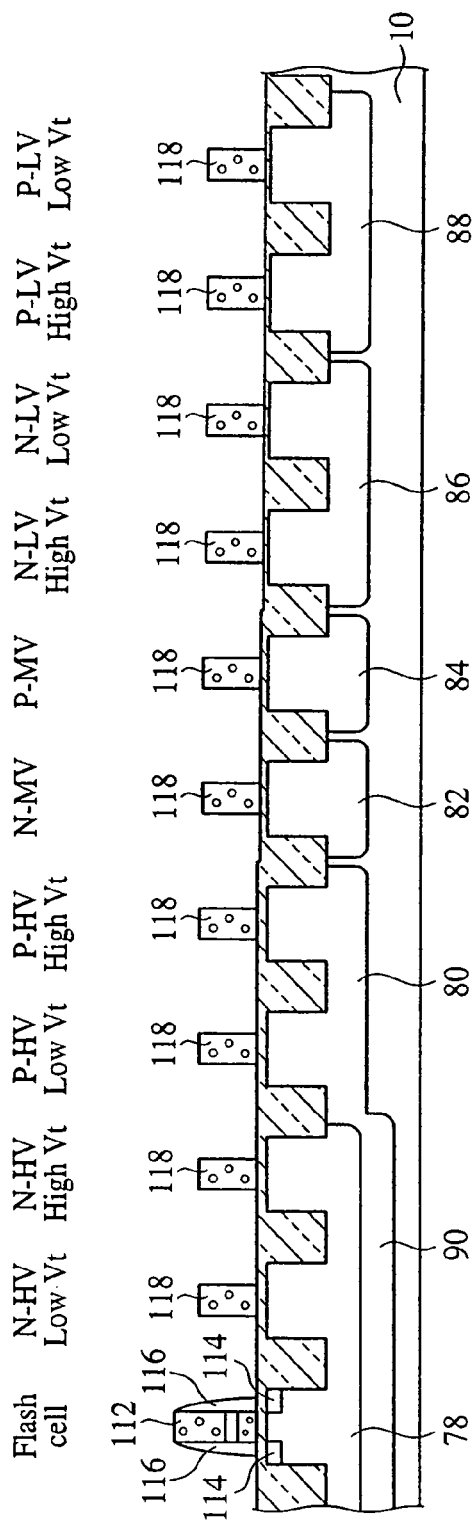
Figure 21C:
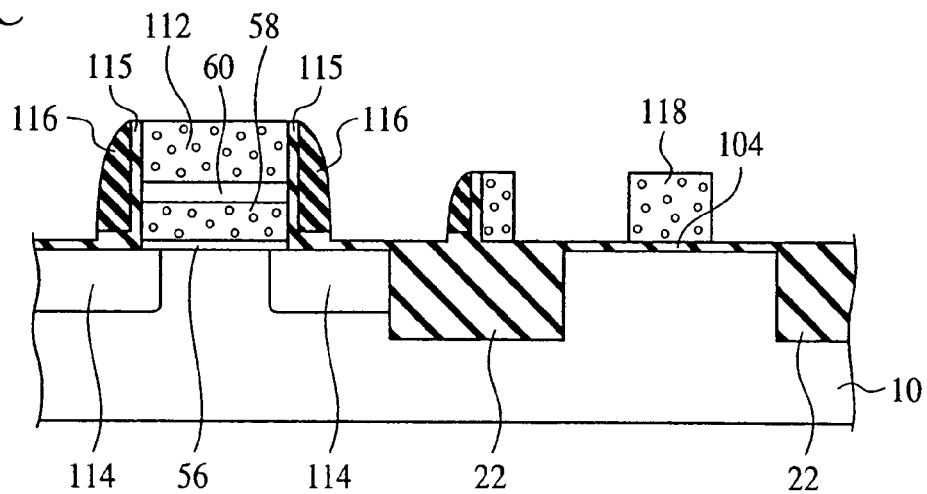

Then, the polycrystalline silicon film 108 in the high-voltage transistors (N-HV Low Vt, N-HV High Vt, P-HV Low Vt, P-HV High Vt) forming regions, the middle-voltage transistors (N-MV, P-MV) forming regions and the low-voltage transistors (N-LV Low Vt, N-LV High Vt, P-LV Low Vt, P-LV High Vt) forming regions is patterned by photolithography and dry etching to form the gate electrode 118 of the polycrystalline silicon film 108 (FIG. 13A, FIG. 21C).

Then a photoresist film 120 exposing the p-channel low-voltage transistors (P-LV Low Vt, P-LV High Vt) forming regions and covering the other regions is formed by photolithography.

Figure 13B:
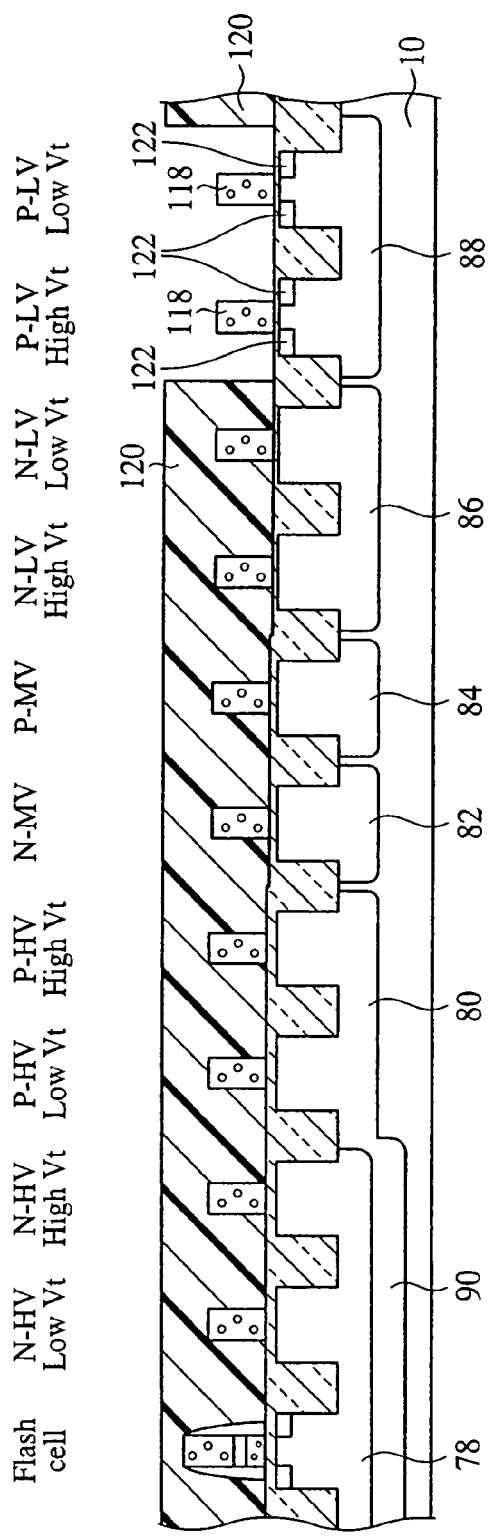

Next, with the photoresist film 120 as the mask, ions are implanted to form the extensions 122 of the source/drain regions of the p-channel low-voltage/high threshold voltage transistor (P-LV High Vt) and the p-channel low-voltage/low threshold voltage transistor (P-LV Low Vt) (FIG. 13B). The extensions 122 having pocket regions are formed by, e.g., implanting boron ions at a 0.5 keV acceleration energy to a dose of 3.6×1014 cm-2 and arsenic ions at a 80 keV acceleration energy to a dose of 6.5×1012 cm-2 in 4 directions tilted by 28 degrees to the normal of the substrate.

Next, the photoresist film 120 is removed by, e.g., ashing.

Then, a photoresist film 124 exposing the n-channel low-voltage transistors (N-LV Low Vt, N-LV High Vt) forming regions and covering the other regions is formed by photolithography.

Figure 14A:
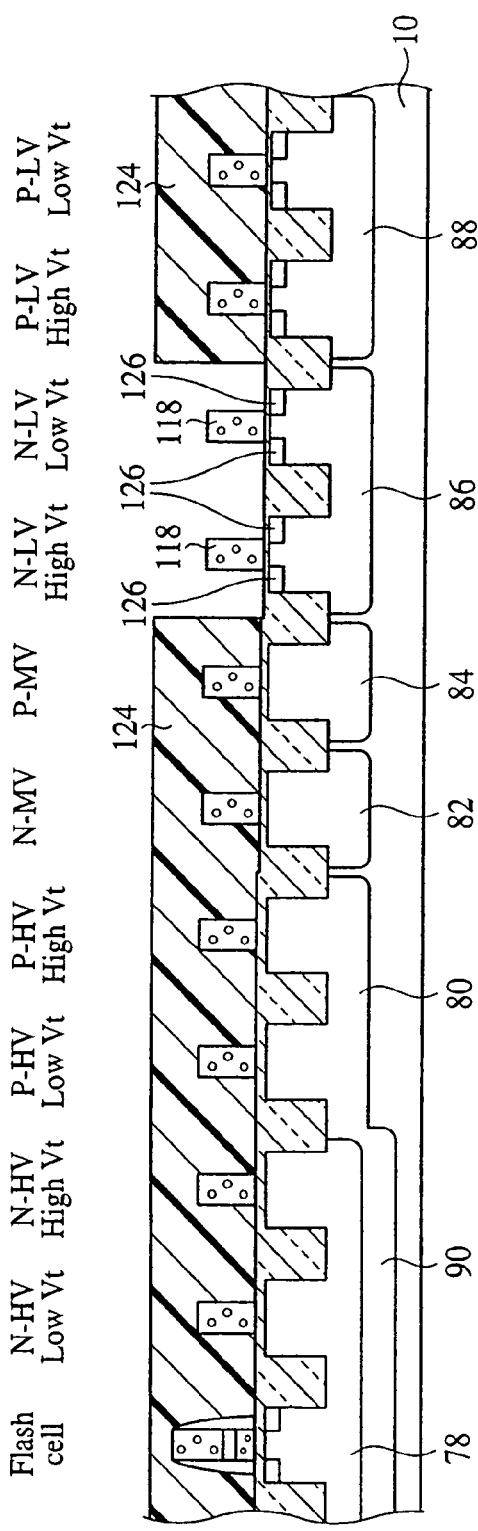

Then, ions are implanted with the photoresist film 124 as the mask to form the extensions 126 of the source/drain regions of the n-channel low-voltage/high threshold voltage transistor (N-LV High Vt) and the n-channel low-voltage/low-threshold voltage transistor (N-LV Low Vt) (FIG. 14A). The extensions 126 having the pocket regions are formed by, e.g., implanting arsenic ions at a 3 keV acceleration energy to a dose of 1.1×1015 cm-2 and boron fluoride ions (BF2+) at a 35 keV acceleration energy to a dose of 9.5×1012 cm-2 in 4 directions tilted by 28 degrees to the normal of the substrate.

Next, the photoresist film 124 is removed by ashing.

Next, a photoresist film 128 exposing the p-channel middle-voltage transistor (P-MV) forming region and covering the other regions is formed by photolithography.

Figure 14B:
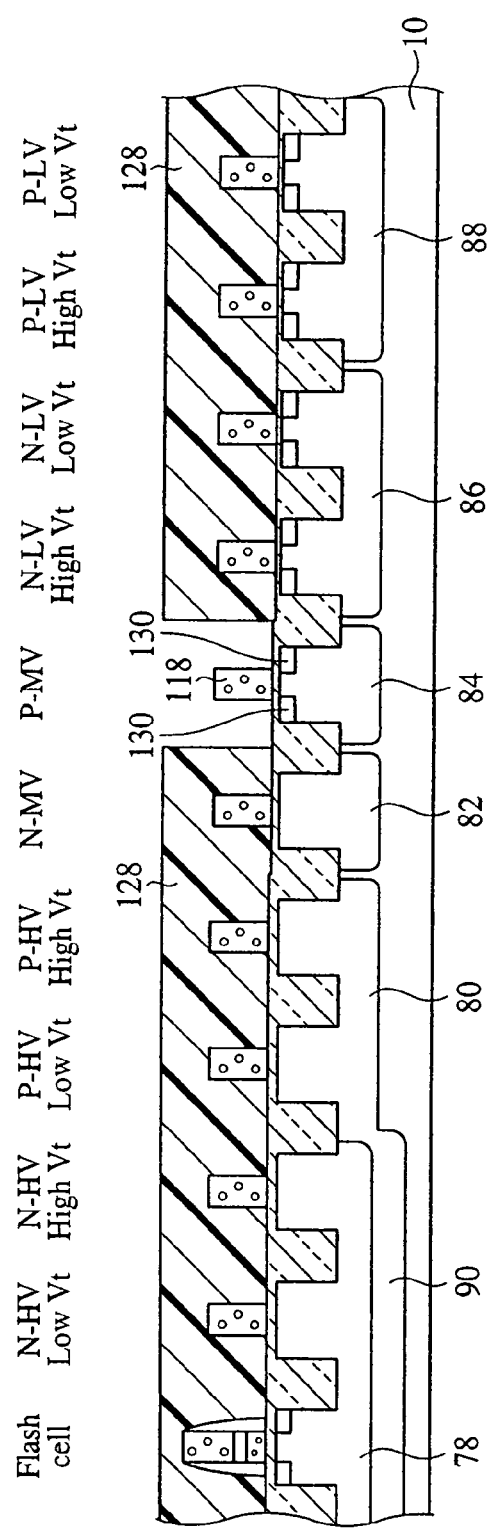

Then, with the photoresist film 128 as the mask, acceptor ions are implanted to form the extensions 130 of the source/drain regions of the p-channel middle-voltage transistor (P-MV) (FIG. 14B). The extensions 130 are formed by, e.g., implanting boron fluoride ions under conditions of a 10 keV acceleration energy and a 7×1013 cm-2 dosage.

Next, the photoresist film 128 is removed by, e.g., ashing.

Then, a photoresist film 132 exposing the n-channel middle-voltage transistor (N-MV) forming region and covering the other regions is formed by photolithography.

Figure 15A:
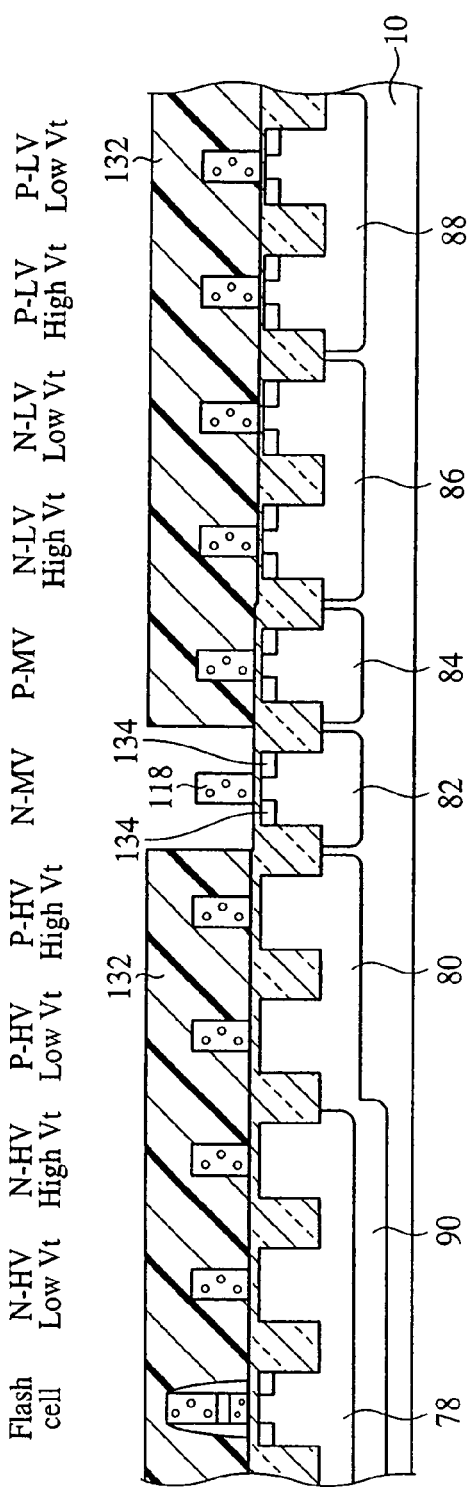

Next, with the photoresist film 132 as the mask, donor ions are implanted to form the extensions 134 of the source/drain regions of the n-channel middle-voltage transistor (N-MV) (FIG. 15A). The extensions 134 are formed by, e.g., implanting arsenic ions under conditions of a 10 keV acceleration energy and a 2×1013 cm-2 dosage and phosphorus ions under conditions of a 10 keV acceleration energy and a 3×1013 cm-2 dosage.

Then, the photoresist film 132 is removed by, e.g., ashing.

Next, a photoresist film 136 exposing the p-channel high-voltage transistors (P-HV Low Vt, P-HV High Vt) forming regions and covering the other regions is formed by photolithography.

Figure 15B:
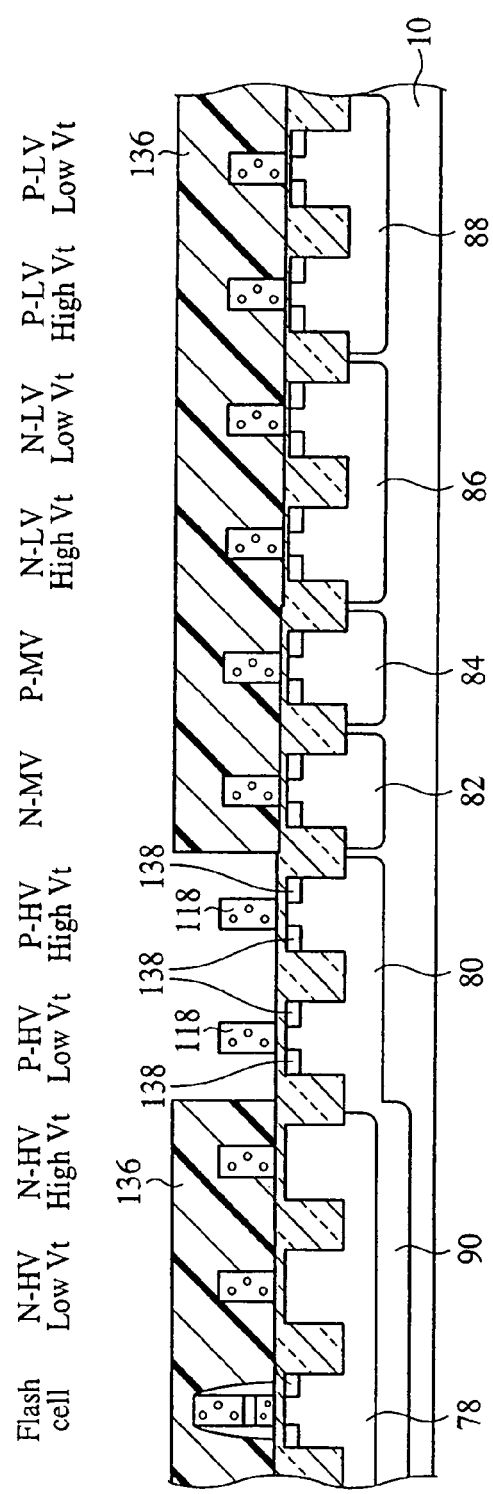

Then, with the photoresist film 136 as the mask acceptor ions are implanted to form the extensions 138 of the source/drain regions of the p-channel high-voltage/low threshold voltage transistor (P-HV Low Vt) forming region and the p-channel high-voltage/high-threshold voltage transistor (P-HV High Vt) forming region (FIG. 15B). The extensions 138 are formed by, e.g., implanting boron fluoride ions under conditions of a 80 keV acceleration energy and a 4.5×1013 cm-2 dosage.

Next, the photoresist film 136 is removed by, e.g., ashing.

Next, a photoresist film 140 exposing the n-channel high-voltage transistors (N-HV Low Vt, N-HV High Vt) forming regions and covering the other regions is formed by photolithography.

Figure 16A:
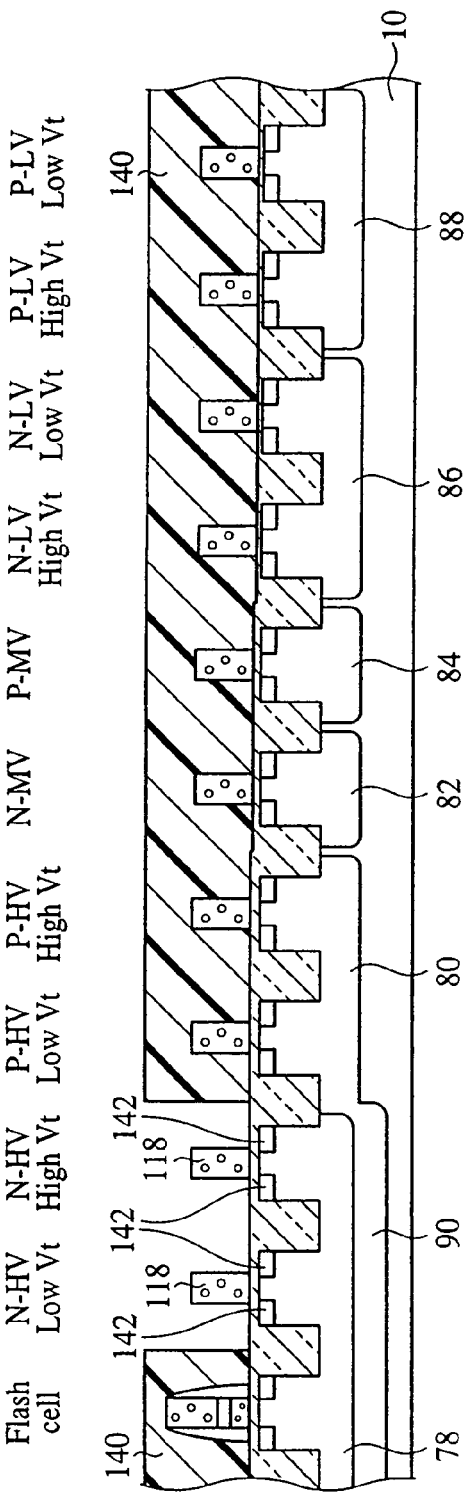
Figure 16B:
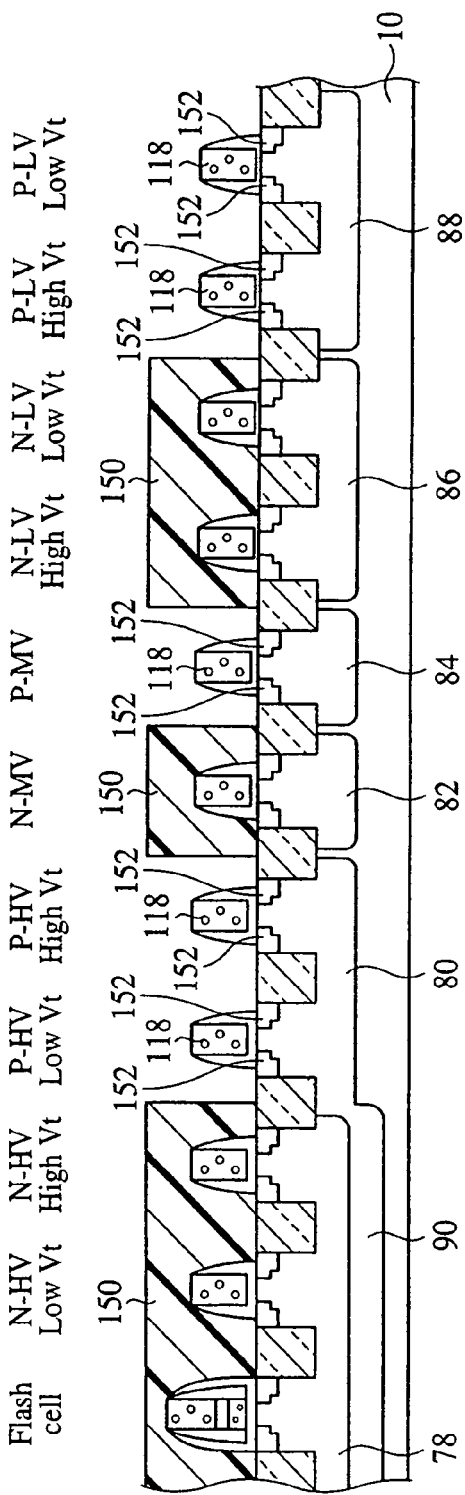

Then, with the photoresist film 140 as the mask, donor ions are implanted to form the extensions 142 of the source/drain regions of the n-channel high-voltage/low threshold voltage transistor (N-HV Low Vt) and the n-channel high-voltage/high-threshold voltage transistor (N-HV High Vt) (FIG. 16A). The extensions 142 are formed by, e.g., implanting phosphorus ions under conditions of a 35 keV acceleration energy and a 4×1013 cm-2 dosage.

Figure 22A:
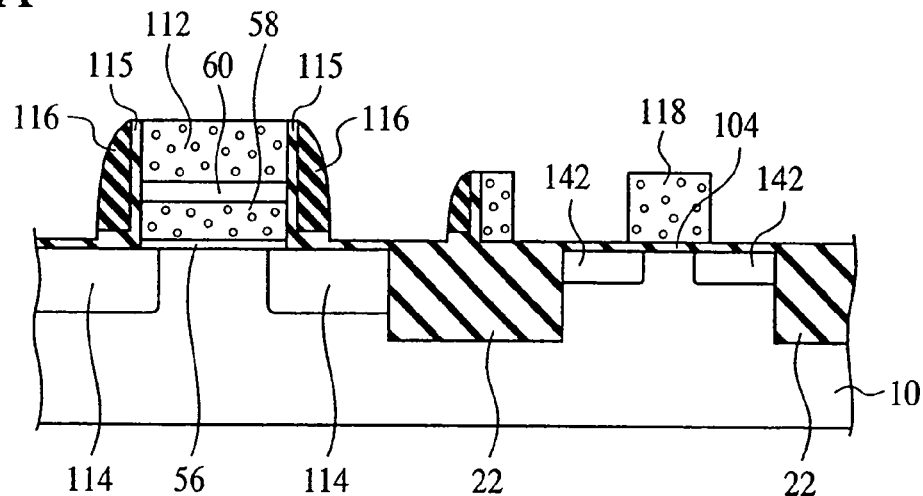
Figure 22B:
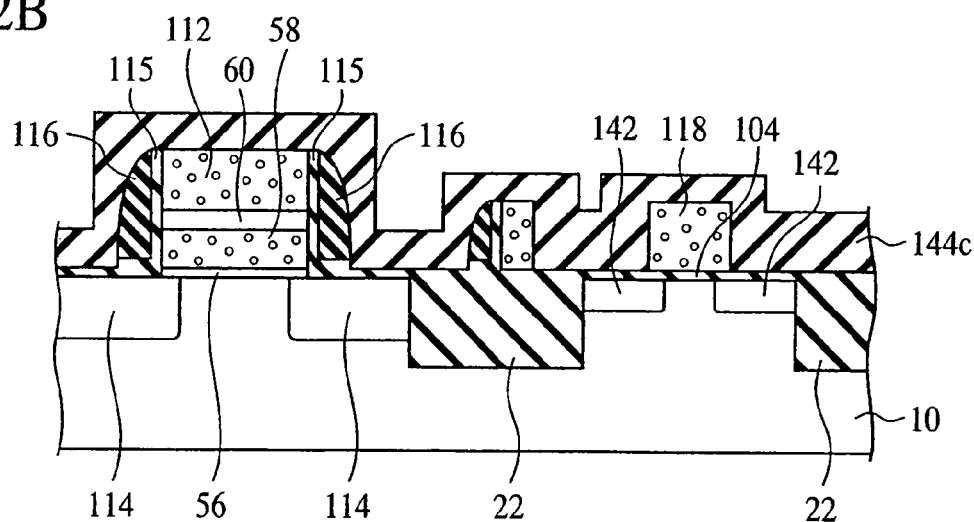

Then, the silicon oxide film 144a of, e.g., a 100 nm-thick is deposited on the entire surface by, e.g., thermal CVD method (FIG. 22B).

Figure 22C:
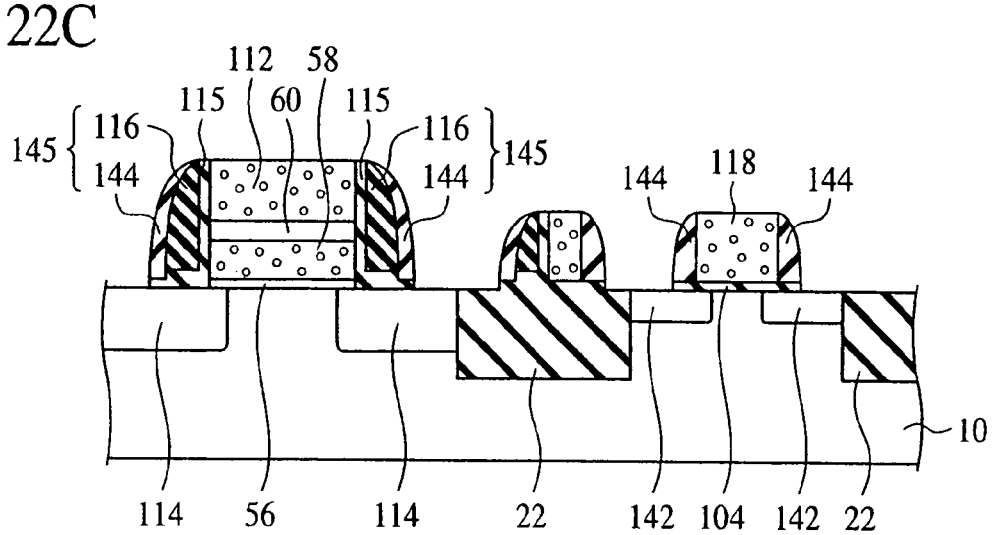

Then, the silicon oxide film 144a is etched back to form the sidewall spacers 144 of the silicon oxide film 144a on the side wall portions of the gate electrode 112 and the floating gate 58 and on the side walls of the gate electrodes 118. Thus, the sidewall spacer 144 of a single layer structure of the silicon oxide film is formed on the side walls of the gate electrodes 118 of the peripheral transistors, and the sidewall spacer 145 of the double layer structure of the sidewall spacer 116 of the silicon nitride film and the sidewall spacer 144 of the silicon oxide film is formed on the side walls of the gate electrode 112 and floating gate 58 of the flash memory cell (FIG. 22C).

At this time, in the peripheral circuit region, concurrently with the silicon oxide film 144a being etched, the gate insulating film 104 is also etched, and the active regions which are not covered with the sidewall spacers 144 are exposed.

On the other hand, in the memory cell region, concurrently with the silicon oxide film 144a being etched, the silicon oxide film 115 is also etched. The film thickness of the silicon oxide film 115 in the region which is not covered by the sidewall spacer 145 is equal to or thinner than the film thickness of the thickest gate insulating film in the peripheral transistor in the etching step of FIG. 21B. Accordingly, the etching in the peripheral circuit region until the active region in the region which is not covered by the sidewall spacer are exposed exposes, in the memory cell region as well, the active region in the region which is not covered by the sidewall spacer 145.

In other words, the etching at a minimum etching amount necessary to form the sidewall spacer 144 of the peripheral transistor can form the sidewall spacer 145 in the memory cell region and exposes the active region in the region which is not covered by the sidewall spacer 145. That is, the method for fabricating the semiconductor device according to the present embodiment performs the etching step of FIG. 21B, whereby the active region is prevented from being excessively exposed to the etching atmosphere, and accordingly, the characteristic degradation of the peripheral transistor can be prevented.

Then, a photoresist film 150 exposing the p-channel transistors (P-HV Low Vt, P-HV High Vt, P-MV, P-LV High Vt, P-LV Low Vt) forming regions and covering the other regions is formed by photolithography.

Then, with the photoresist film 150 as the mask, acceptor ions are implanted to from the source/drain regions 152 in the p-channel transistors (P-HV Low Vt, P-HV High Vt, P-MV, P-LV High Vt, P-LV Low Vt). Concurrently therewith, the gate electrodes 118 of the p-channel transistors (P-HV Low Vt, P-HV High Vt, P-MV, P-LV High Vt, P-LV Low Vt) are doped with the p-type by this ion implantation step. The source/drain regions 152 are formed by, e.g., implanting boron ions under conditions of a 5 keV acceleration energy and a 4×1015 cm-2 dosage.

Then, the photoresist film 140 is removed by, e.g., ashing.

Then, a photoresist film 146 exposing the flash memory cell (Flash cell) forming region and the n-channel transistors (N-HV Low Vt, N-HV High Vt, N-MV, N-LV High Vt, N-LV Low Vt) forming regions and covering the other regions is formed by photolithography.

Figure 17A:
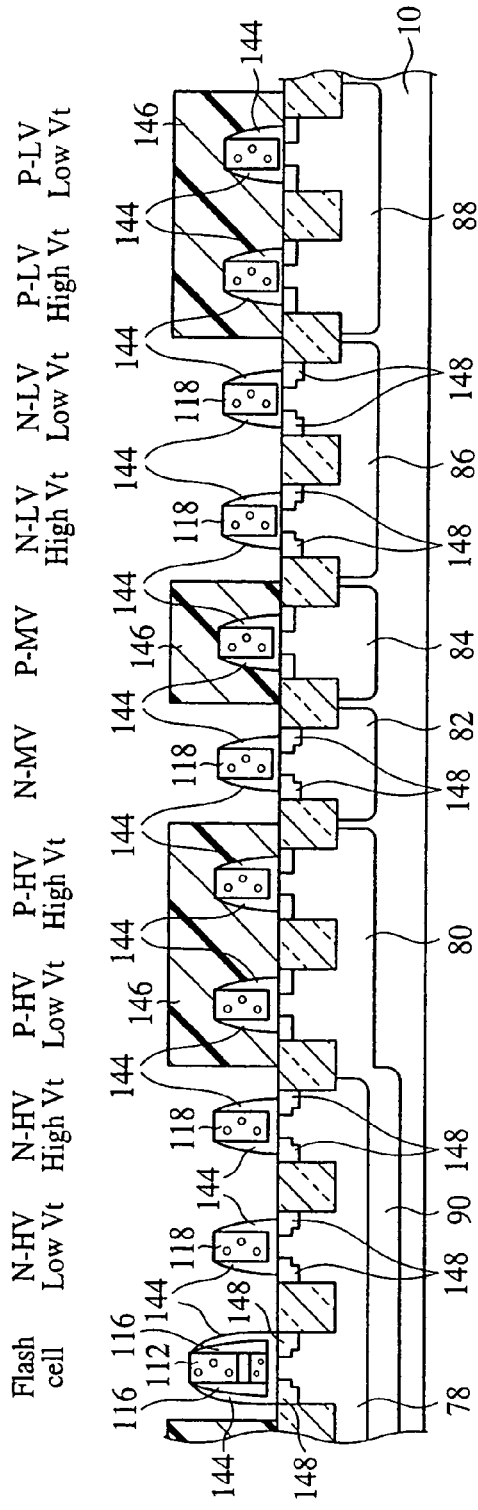

Then, with the photoresist film 146 as the mask, donor ions are implanted to form the source/drain regions 148 of the flash memory cell (Flash cell) and the n-channel transistors (N-HV Low Vt, N-HV High Vt, N-MV, N-LV High Vt, N-LV Low Vt) (FIG. 17A). Concurrently therewith, the gate electrode 112 of the flash memory cell (Flash cell) and the gate electrodes 118 of the n-channel transistors (N-HV Low Vt, N-HV High Vt, N-MV, N-LV High Vt, N-LV Low Vt) are doped with the n-type by this ion implantation step. The source/drain regions 148 are formed by, e.g., implanting phosphorus ions under conditions of a 10 keV acceleration energy and a 6×1015 cm-2 dosage.

Next, the photoresist film 146 is removed by, e.g., ashing.

Figure 17B:
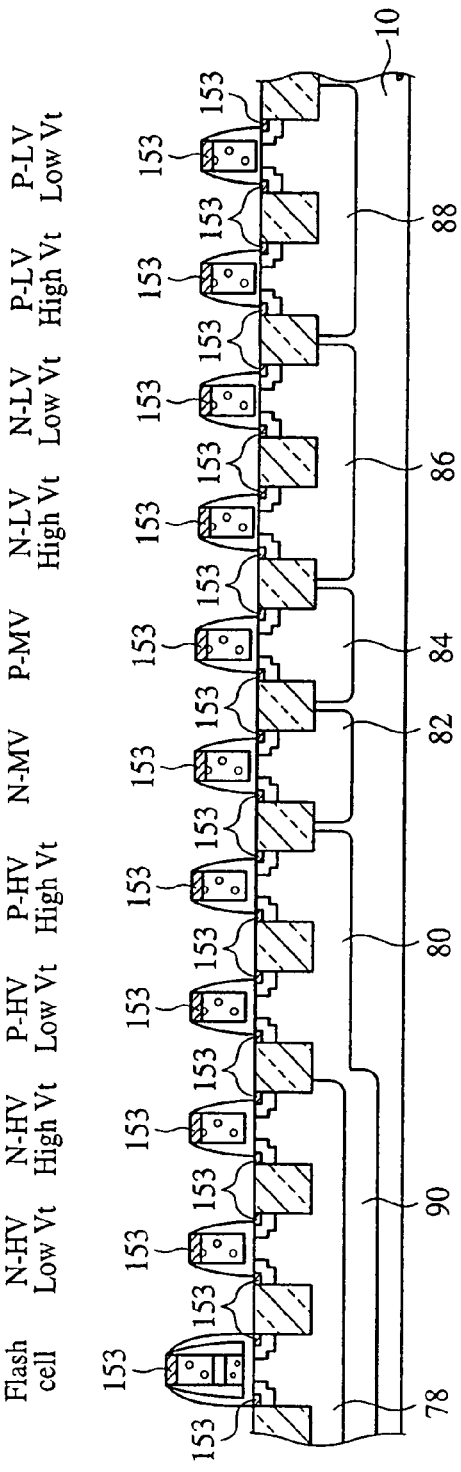

Then, the surfaces of the gate electrodes 112, 118 and the surfaces of the source/drain regions 148, 152 are selectively silicidized by the known salicide process to form the silicide film 153 on the gate electrodes 112, 118 and the source/drain regions 148, 152 (FIG. 17B). For example, first, the silicon oxide film 115, etc. remaining on the active regions are removed by wet pre-treatment. Next, a cobalt (Co) film and a titanium nitride (TiN) film are deposited on the entire surface. Then, by rapid thermal processing, the surfaces of the gate electrodes 112, 118 and of the source/drain regions 148, 152, where the silicon is exposed, is selectively silicidized to form a cobalt silicide film on these regions. Then, the cobalt film and the titanium nitride film which remain unreacted is removed. Next, again by rapid thermal processing, the cobalt silicide film is made less resistive. Thus, the silicide film 153 of the cobalt silicide film is formed.

Thus, the eleven kinds of transistors are thus completed on the silicon substrate 10.

Figure 18:
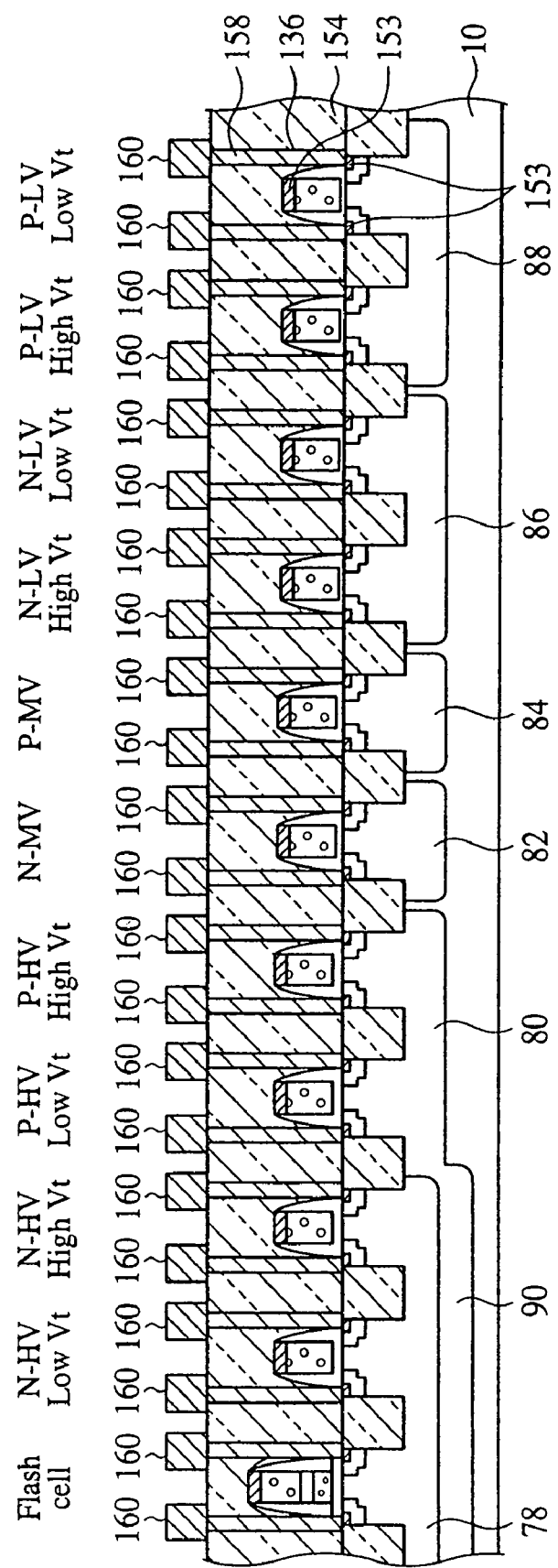

Then, the insulating film 154 is formed on the silicon substrate 10 with the transistors, etc. formed on, and then the contact holes 156, the electrode plugs 158, the interconnections 160, etc. are formed. Thus, a first metal interconnection layer is completed (FIG. 18).

Then, the growth of the insulating film, the formation of the interconnection layers, etc. are repeated to thereby form a multi-level interconnection layer 162 of a required layer number is formed on the insulating film 154.

Next, the insulating film 164 is grown on the multi-level interconnection layer 162, and then the contact holes 166, the electrode plugs 168, the interconnections 170, the pad electrodes 172, etc. are formed. Thus, the layers up to the uppermost metal interconnection layer are completed.

Figure 19:
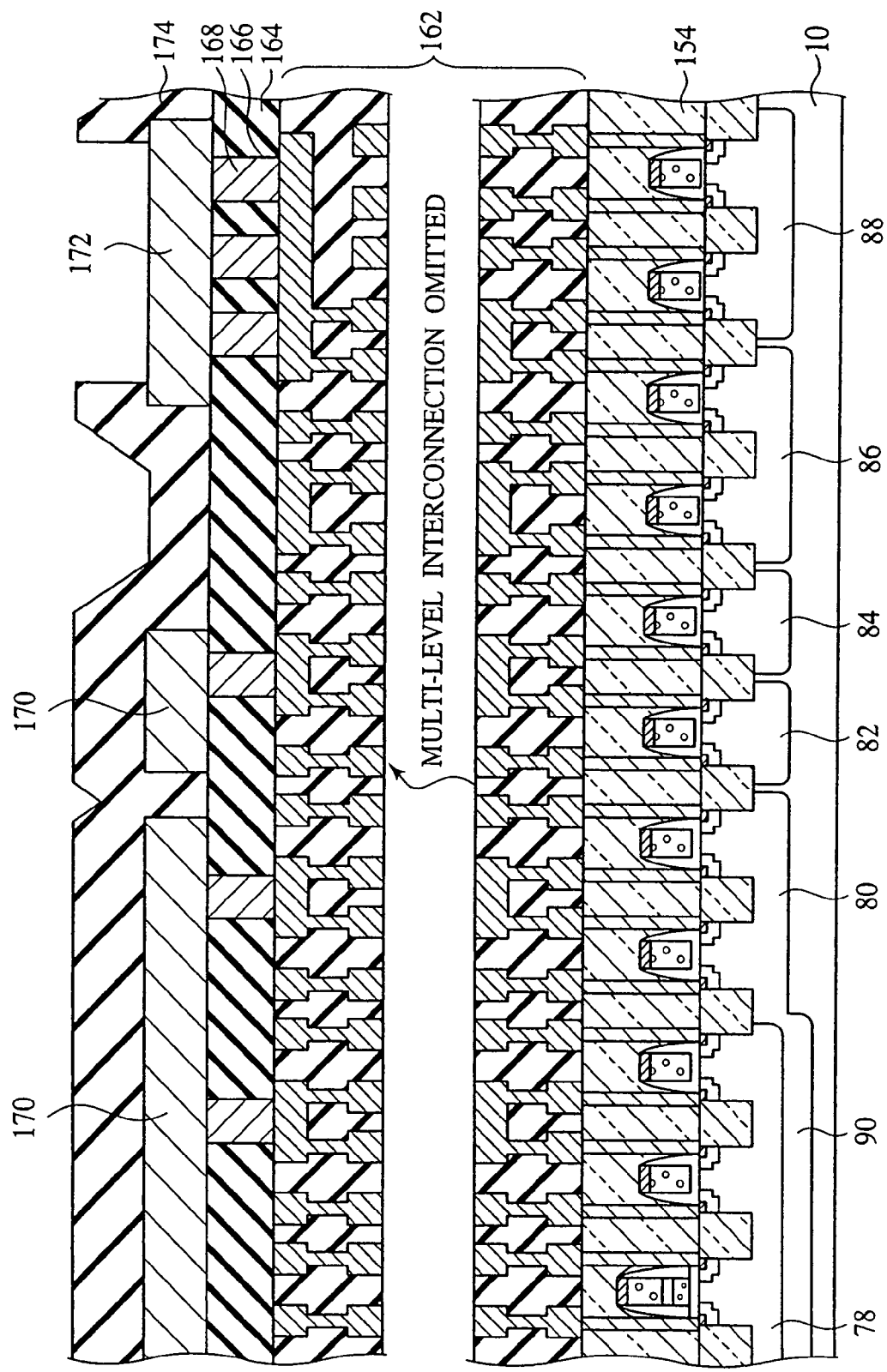

Then, a passivation film 174 is formed on the insulating film 164 with the interconnection layer 170, the pad electrodes 172, etc. formed on, and the semiconductor device is completed (FIG. 19).

As described above, according to the present embodiment, the sidewall spacers 116 are formed, and then before the sidewall spacers 114 are formed, the step of removing a part of the silicon oxide film 115 is performed to thereby make the film thickness of the silicon oxide film 115 below the sidewall spacers 144 thinner than the film thickness of the silicon oxide film 115 below the sidewall spacers 116, whereby the silicon oxide film 115 on the source/drain regions 148 can be completely removed by the usual step of fabricating the peripheral transistor and the pre-treatment of the salicide steps. Accordingly, the failure to form the silicide film 153 on the source/drain regions 148 is prevented, whereby the defective contact can be suppressed.

In forming the sidewall spacer 144 of the peripheral transistor it is not necessary to increase the etching amount in accordance with a film thickness of the silicon oxide film 115. Accordingly, the peripheral circuit forming region is prevented from being excessively exposed to the etching atmosphere, whereby the reliability drop of the peripheral transistor can be suppressed.

Especially in oxidizing the side walls of the gate electrode of the flash memory cell to thereby improve the charge retaining characteristics, as in the present embodiment, the silicon oxide film 115 on the active regions is thick, and it is very effective to remove a part of the silicon oxide film 115.

Modified Embodiments

The present invention is not limited to the above-described embodiment and can cover other modifications.

For example, in the above-described embodiment, the semiconductor device and the method for fabricating the same according to the present invention have been explained by means of an FPGA combined with a flash memory. However, the semiconductor device according to the present invention is not essentially applied to FPGAs. The present invention is applicable widely to the semiconductor devices having the sidewall spacer of the double layer structure of the flash memory cell and the sidewall spacer of the single layer structure of the peripheral transistor.

In the above-described embodiment, the semiconductor device combined with the flash memory is formed of 11 kinds of transistors, but the number of the transistors is not limited to 11. The kinds of the transistors mounted on the semiconductor device can be increased or decreased in accordance with an application. Circuits to be formed can be various.

What is claimed is:

1. A method for fabricating a semiconductor device comprising the steps of:
    forming a first conducting film over a first region of a semiconductor substrate;
    forming a second conducting film at least over the first conducting film formed in the first region;
    patterning the second conducting film to form a control gate of the first transistor in the first region;
    patterning the first conducting film with the control gate as a mask to form a floating gate of the first transistor;
    forming by thermal oxidation an oxide film on a surface of the semiconductor substrate, a side wall of the floating gate and a side wall of the control gate;
    forming a first sidewall spacer of a first insulating film on the side wall of the floating gate and the side wall of the control gate with the oxide film formed on;
    removing the oxide film formed on the surface of the semiconductor substrate with the first sidewall spacer as a mask; and
    forming a second sidewall spacer of a second insulating film on the side wall of the floating gate and the side wall of the control gate with the oxide film and the first sidewall spacer formed on.

2. A method for fabricating a semiconductor device according to claim 1,
    further comprising, after the step of removing the oxide film and before the step of forming the second sidewall spacer, the step of: patterning the second conducting film in a second region of the semiconductor substrate to form a gate electrode of a second transistor in the second region,
    in the step of forming a second sidewall spacer, the second sidewall spacer being also formed on a side wall of the gate electrode without interposing the first insulating film therebetween.

3. A method for fabricating a semiconductor device according to claim 1, wherein
    in the step of removing the oxide film, the oxide film is removed so that a residual film thickness of the oxide film on the surface of the semiconductor substrate after the oxide film has been etched is thinner than a film thickness of a gate insulating film of a transistor to be formed in the second region.

4. A method for fabricating a semiconductor device according to claim 1,
    further comprising: after the step of forming the second conducting film and before the step of forming the control gate, the step of forming a third insulating film on the first conducting film,
    in the step of forming the oxide film, with the third insulating film as a mask, the semiconductor substrate, the first conducting film and the second conducting film are oxidized.

5. A method for fabricating a semiconductor device according to claim 4, wherein
    in the step forming the control gate and the step of forming the gate electrode, the third insulating film is used as an anti-reflection film for lithography.

6. A method for fabricating a semiconductor device according to claim 4, wherein
    the third insulating film is removed when the second sidewall spacer is formed.

7. A method for fabricating a semiconductor device according to claim 1, further comprising, after the step of forming the second sidewall spacer, the step of forming a silicide film selectively on the semiconductor substrate and the control gate.

8. A method for fabricating a semiconductor device according to claim 1, wherein in the step of removing the oxide film, the oxide film is etched by wet etching.

9. A method for fabricating a semiconductor device according to claim 1, wherein the first insulating film is a silicon nitride film, and the second insulating film is a silicon oxide film.

* * * * *